United States Patent
Bertin et al.

(10) Patent No.: US 8,362,525 B2
(45) Date of Patent: Jan. 29, 2013

(54) FIELD EFFECT DEVICE HAVING A CHANNEL OF NANOFABRIC AND METHODS OF MAKING SAME

(75) Inventors: Claude L. Bertin, South Burlington, VT (US); Mitchell Meinhold, Arlington, MA (US); Steven L. Konsek, Boston, MA (US); Thomas Rueckes, Rockport, MA (US); Frank Guo, Danville, CA (US)

(73) Assignee: Nantero Inc., Woburn, MA (US)

( * ) Notice: Subject to any disclaimer, the term of this patent is extended or adjusted under 35 U.S.C. 154(b) by 335 days.

(21) Appl. No.: 11/332,529

(22) Filed: Jan. 13, 2006

(65) Prior Publication Data

US 2006/0183278 A1    Aug. 17, 2006

Related U.S. Application Data

(60) Provisional application No. 60/644,427, filed on Jan. 14, 2005, provisional application No. 60/644,641, filed on Jan. 18, 2005.

(51) Int. Cl.
*H01L 21/335* (2006.01)
*H01L 21/336* (2006.01)
*H01L 29/76* (2006.01)

(52) U.S. Cl. ... 257/213; 438/142; 438/197; 257/E51.04; 257/288; 977/938; 977/742; 977/845

(58) Field of Classification Search .......... 977/936–938, 977/742–752, 842–848; 257/E51.04, 213, 257/288
See application file for complete search history.

(56) References Cited

U.S. PATENT DOCUMENTS

| | | | |
|---|---|---|---|
| 3,448,302 | A | 6/1969 | Shanefield |
| 4,845,533 | A | 7/1989 | Pryor et al. |
| 4,853,893 | A | 8/1989 | Eaton, Jr. et al. |
| 4,888,630 | A | 12/1989 | Paterson |
| 4,979,149 | A | 12/1990 | Popovic et al. |
| 5,198,994 | A | 3/1993 | Natori et al. |
| 5,414,654 | A | 5/1995 | Kubota et al. |
| 5,682,345 | A | 10/1997 | Roohparvar et al. |
| 5,818,748 | A | 10/1998 | Bertin et al. |

(Continued)

FOREIGN PATENT DOCUMENTS

| | | |
|---|---|---|
| GB | 2364933 A | 2/2002 |
| WO | WO-00/48195 | 8/2000 |

(Continued)

OTHER PUBLICATIONS

Dictionary Entry: "Fabric", Merriam Webster Dictionary, retrieved Oct. 7, 2009.*

(Continued)

*Primary Examiner* — Kevin Parendo
(74) *Attorney, Agent, or Firm* — Nantero Inc.

(57) ABSTRACT

Field effect devices having channels of nanofabric and methods of making same. A nanotube field effect transistor is made to have a substrate, and a drain region and a source region in spaced relation relative to each other. A channel region is formed from a fabric of nanotubes, in which the nanotubes of the channel region are substantially all of the same semiconducting type of nanotubes. At least one gate is formed in proximity to the channel region so that the gate may be used to modulate the conductivity of the channel region so that a conductive path may be formed between the drain and source region. Forming a channel region includes forming a fabric of nanotubes in which the fabric has both semiconducting and metallic nanotubes and the fabric is processed to remove substantially all of the metallic nanotubes.

46 Claims, 37 Drawing Sheets

U.S. PATENT DOCUMENTS

| | | | |
|---|---|---|---|
| 5,834,818 A | 11/1998 | Beilstein, Jr. et al. | |
| 5,920,101 A | 7/1999 | Beilstein, Jr. et al. | |
| 5,982,004 A * | 11/1999 | Sin et al. | 257/347 |
| 6,044,008 A | 3/2000 | Choi et al. | |
| 6,048,740 A | 4/2000 | Hsu et al. | |
| 6,097,241 A | 8/2000 | Bertin et al. | |
| 6,097,243 A | 8/2000 | Bertin et al. | |
| 6,128,214 A | 10/2000 | Kuekes et al. | |
| 6,141,245 A | 10/2000 | Bertin et al. | |
| 6,159,620 A | 12/2000 | Heath et al. | |
| 6,198,655 B1 | 3/2001 | Heath et al. | |
| 6,219,215 B1 | 4/2001 | Bertin et al. | |
| 6,243,283 B1 | 6/2001 | Bertin et al. | |
| 6,256,767 B1 | 7/2001 | Kuekes et al. | |
| 6,314,019 B1 | 11/2001 | Kuekes et al. | |
| 6,345,362 B1 | 2/2002 | Bertin et al. | |
| 6,346,846 B1 | 2/2002 | Bertin et al. | |
| 6,353,552 B2 | 3/2002 | Sample et al. | |
| 6,373,771 B1 | 4/2002 | Fifield et al. | |
| 6,423,583 B1 * | 7/2002 | Avouris et al. | 438/132 |
| 6,426,687 B1 | 7/2002 | Osborn | |
| 6,430,511 B1 | 8/2002 | Tour et al. | |
| 6,445,006 B1 | 9/2002 | Brandes et al. | |
| 6,459,095 B1 | 10/2002 | Heath et al. | |
| 6,462,977 B2 | 10/2002 | Butz | |
| 6,515,339 B2 | 2/2003 | Shin et al. | |
| 6,518,156 B1 | 2/2003 | Chen et al. | |
| 6,548,841 B2 | 4/2003 | Frazier et al. | |
| 6,559,468 B1 | 5/2003 | Kuekes et al. | |
| 6,574,130 B2 | 6/2003 | Segal et al. | |
| 6,587,408 B1 | 7/2003 | Jacobson et al. | |
| 6,625,047 B2 | 9/2003 | Coleman, Jr. | |
| 6,625,740 B1 | 9/2003 | Datar et al. | |
| 6,643,165 B2 | 11/2003 | Segal et al. | |
| 6,661,270 B2 | 12/2003 | Nagata | |
| 6,706,402 B2 | 3/2004 | Rueckes et al. | |
| 6,707,098 B2 | 3/2004 | Hofmann et al. | |
| 6,740,910 B2 | 5/2004 | Roesner et al. | |
| 6,759,693 B2 | 7/2004 | Vogeli et al. | |
| 6,774,052 B2 | 8/2004 | Vogeli et al. | |
| 6,784,028 B2 | 8/2004 | Rueckes et al. | |
| 6,794,914 B2 | 9/2004 | Sani et al. | |
| 6,803,840 B2 | 10/2004 | Hunt et al. | |
| 6,809,465 B2 | 10/2004 | Jin | |
| 6,835,591 B2 | 12/2004 | Rueckes et al. | |
| 6,911,682 B2 | 6/2005 | Rueckes et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,924,538 B2 | 8/2005 | Jaiprakash et al. | |
| 6,942,921 B2 | 9/2005 | Rueckes et al. | |
| 6,955,937 B1 | 10/2005 | Burke et al. | |
| 6,968,486 B2 | 11/2005 | Matsushima | |
| 6,969,651 B1 | 11/2005 | Lu et al. | |
| 6,972,467 B2 * | 12/2005 | Zhang et al. | 257/401 |
| 6,986,962 B2 | 1/2006 | Oyanagi et al. | |
| 6,990,009 B2 | 1/2006 | Bertin et al. | |
| 7,015,500 B2 | 3/2006 | Choi et al. | |
| 7,054,194 B2 | 5/2006 | Liaw et al. | |
| 7,115,901 B2 | 10/2006 | Bertin et al. | |
| 7,115,960 B2 | 10/2006 | Bertin et al. | |
| 7,161,403 B2 | 1/2007 | Bertin | |
| 7,259,410 B2 | 8/2007 | Jaiprakash et al. | |
| 2001/0023986 A1 | 9/2001 | Mancevski | |
| 2002/0006721 A1 * | 1/2002 | Thomas | 438/639 |
| 2002/0084463 A1 * | 7/2002 | Sanford et al. | 257/82 |
| 2002/0173083 A1 | 11/2002 | Avouris et al. | |
| 2002/0175390 A1 | 11/2002 | Goldstein et al. | |
| 2003/0021141 A1 | 1/2003 | Segal et al. | |
| 2003/0021966 A1 | 1/2003 | Segal et al. | |
| 2003/0124325 A1 | 7/2003 | Rueckes et al. | |
| 2003/0132823 A1 | 7/2003 | Hyman et al. | |
| 2003/0148562 A1 | 8/2003 | Luyken et al. | |
| 2003/0165074 A1 | 9/2003 | Segal et al. | |
| 2003/0170930 A1 | 9/2003 | Choi et al. | |
| 2003/0178617 A1 | 9/2003 | Appenzeller et al. | |
| 2003/0199172 A1 | 10/2003 | Rueckes et al. | |
| 2003/0200521 A1 | 10/2003 | DeHon et al. | |
| 2003/0206436 A1 | 11/2003 | Eaton et al. | |
| 2004/0023514 A1 | 2/2004 | Moriya et al. | |
| 2004/0027889 A1 | 2/2004 | Occhipinti et al. | |
| 2004/0031975 A1 | 2/2004 | Kern et al. | |
| 2004/0043148 A1 | 3/2004 | Wei et al. | |
| 2004/0075125 A1 | 4/2004 | Asao | |
| 2004/0085805 A1 | 5/2004 | Segal et al. | |
| 2004/0095837 A1 | 5/2004 | Choi et al. | |
| 2004/0147037 A1 * | 7/2004 | Dai et al. | 436/147 |
| 2004/0159833 A1 | 8/2004 | Rueckes et al. | |
| 2004/0164327 A1 | 8/2004 | Shin et al. | |
| 2004/0192072 A1 * | 9/2004 | Snow et al. | 438/800 |
| 2004/0201063 A1 * | 10/2004 | Fukuda | 257/347 |
| 2004/0232477 A1 * | 11/2004 | Iwata et al. | 257/315 |
| 2004/0238887 A1 | 12/2004 | Nihey | |
| 2004/0238907 A1 | 12/2004 | Pinkerton et al. | |
| 2005/0013988 A1 | 1/2005 | Ward et al. | |
| 2005/0056877 A1 | 3/2005 | Rueckes et al. | |
| 2005/0058590 A1 | 3/2005 | Sen et al. | |
| 2005/0068128 A1 | 3/2005 | Yip | |
| 2005/0079659 A1 * | 4/2005 | Duan et al. | 438/197 |
| 2005/0139902 A1 | 6/2005 | Jung | |
| 2005/0141266 A1 | 6/2005 | Jung | |
| 2005/0141272 A1 | 6/2005 | Jung | |
| 2005/0162896 A1 | 7/2005 | Jung | |
| 2005/0174842 A1 | 8/2005 | Bertin et al. | |
| 2005/0269554 A1 | 12/2005 | Sen et al. | |
| 2006/0183278 A1 | 8/2006 | Bertin et al. | |
| 2006/0237537 A1 | 10/2006 | Empedocles et al. | |
| 2006/0284218 A1 * | 12/2006 | Kaner et al. | 257/288 |

FOREIGN PATENT DOCUMENTS

| | | |
|---|---|---|
| WO | WO-0048196 C2 | 8/2000 |
| WO | WO-01/03208 A1 | 1/2001 |

OTHER PUBLICATIONS

U.S. Appl. No. 10/341,005, Ward et al.
U.S. Appl. No. 10/341,054, Ward et al.
U.S. Appl. No. 10/341,130, Ward et al.
U.S. Appl. No. 10/341,055, Ward et al.
Appenzeller, J. et al., "A 10 nm MOSFET Concept", *Microelectronic Engineering*, vol. 56, pp. 213-219, 2001.
Appenzeller, J. et al., "Carbon Nanotube Electronics", *IEEE Transactions on Nanotechnology*, vol. 1, No. 4, pp. 184-189, 2002.
Appenzeller, J. et al., "Field-Modulated Carrier Transport in Carbon Nanotube Transistors", *Physical Review Letters*, vol. 89, No. 2, pp. 126801-1-126801-4, 2002.
Appenzeller, J. et al., "Optimized Contact Configuration for the Study of Transport Phenomena in Ropes of Single-wall Carbon Nanotubes", *Applied Physics Letters*, vol. 78, No. 21, pp. 3313-3315, 2001.
Avouris, PH, "Carbon Nanotube Electronics", *Chemical Physics*, vol. 281, pp. 429-445, 2002.
Avouris, PH, "Molecular Electronics with Carbon Nanotubes", *Accounts of Chemical Research*, vol. 35, No. 12, pp. 1026-1035, 2002.
Avouris, Ph. et al., "Carbon Nanotube Electronics and Optoelectronics", *IEEE*, 2004.
Bachtold, A. et al., "Logic Circuits with Carbon Nanotube Transistors", *Science*, vol. 294, pp. 1317-1320, 2001.
Bachtold, A. et al., "Logic Circuits Based on Carbon Nanotubes", Elsevier Science B.V., Physica E 16, pp. 42-46, 2003.
Bernholc et al., "Mechanical and Electrical Properties of Nanotubes", *Ann. Rev. Mater. Res.*, vol. 32, p. 347, 2002.
Bertin, C., "Known Good Die", *Area Array Interconnection Handbook*, Chapter 4.
Bradley, K. et al., "Flexible Nanotube Electronics," *Nano Letters*, vol. 3, No. 10, pp. 1353-1355, 2003.
Brehob, M. et al., "The Potential of Carbon-based Memo Systems", pp. 1-5.
Chen, J. et al., "Self-aligned Carbon Nanotube Transistors With Charge Transfer Doping", *Applied Physics Letters*, 86, 123108-1, 2005.
Chen, J. et al., "Self-aligned Carbon Nanotube Transistors with Novel Chemical Doping", *IEEE*, 2004.

Choi, W.B. et al., "Carbon-Nanotube-Based Nonvolatile Memory with Oxide-Nitride-Oxide Film and Nanoscale Channel", *Applied Physics Letters*, vol. 82, No. 2, pp. 275-277, 2003.

Collins, P.G. et al., "Engineering Carbon Nanotubes and Nanotube Circuits Using Electrical Breakdown", *Science*, vol. 292, pp. 706-709, 2001.

Collins, P.G., "Current Saturation and Electrical Breakdown in Multiwalled Carbon Nanotubes", *Physical Review Letters*, vol. 86, No. 14, pp. 3128-3131, 2001.

Collins, P.G., "Nanotubes for Electronics", *Scientific American*, pp. 62-69, Dec. 2000.

Cui, J. B. et al., "Carbon Nanotube Memory Devices of High Charge Storage Stability", *Applied Physics Letters*, vol. 81, No. 17, pp. 3260-3262, 2002.

Das, G. et al., "Wafer-Level Test", *Area Array Interonnection Handbook* (reference book), Chapter 3, editors K. Puttlitz and P. Totta, Kluwer Academic Publishers, 2001.

Derycke, V. et al., "Carbon Nanotube Inter- and Intramolecular Logic Gates", *Nano Letters*, vol. 1, No. 9, pp. 453-456, 2001.

Derycke, V. et al., "Controlling Doping and Carrier Injection in Carbon Nanotube Transistors", *Applied Physics Letters*, vol. 80, No. 15, pp. 2773-2775, Apr. 15, 2002.

Duan, X. et al., "Nonvolatile Memory and Programmable Logic from Molecule-Gated Nanowires", *American Chemical Society, Nano Letters*, vol. 0, No. 0 A-D, Mar. 2002.

Fuhrer, M.S. et al., "High-Mobility Nanotube Transistor Memory", *Nano Letters*, vol. 2, No. 7, pp. 755-759, 2002.

Heinze, S. et al., "Electrocostatic Engineering of Nanotube Transistors for Imrpoved Performance", *Applied Physics Letters*, vol. 83, No. 24, pp. 5038-5040, 2003.

Heinze, S. et al., "Unexpected Scaling of the Performance of Carbon Nanotube Transistsors", published on the web, Feb. 10, 2003.

Heinze, S., "Carbon Nanotubes as Schottky Barrier Transistors", *Physical Review Letters*, vol. 89, No. 10, pp. 106801-1-106801-4, Sep. 2, 2002.

Huang, Y. et al., "Logic Gates and Computation from Assembled Nanowire Building Blocks", Science, vol. 294, pp. 1313-1317, Nov. 9, 2001.

Itoh, K., "VLSI Memory Chip Design", *Springer Publisher*, pp. 37-46, 2001.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "Carbon Nanotube Transistor Arrays for Multistage Complementary Logic and Ring Oscillators", *Nano Letters*, vol. 2. No. 9, pp. 929-932, 2002.

Javey, A. et al., "High-k Dielectrics for Advanced Carbon-nanotube Transistors and Logic Gates", *from a nature materials Online Publication*, www.nature.com/naturematerials, Nov. 17, 2002.

Kinaret, J. et al., "A Carbon-nanotube-based Nanorelay", *Applied Physics Letters*, vol. 82, No. 8, pp. 1287-1289, Feb. 2003.

Lin, Y-M, "Novel Carbon Nanotube FET Design with Tunable Polarity", *IEEE*, 2004.

Luyken, R.J. et al., "Concepts for Hybrid CMOS-molecular Nonvolatile Memories", *Nanotechnology*, vol. 14. pp. 273-276, 2003.

Martel, R. et al., "Ambipolar Electrical Transport in Semiconducting Single-Wall Carbon Nanotubes", *Physical Review Letters*, vol. 87, No. 25, pp. 256805-1-256805-4, Dec. 17, 2001.

Martel, R. et al., "Carbon Nanotube Field-Effect Transistors and Logic Circuits", *DAC*, vol. 7. No. 4, pp. 94-98, 2002.

Martel, R. et al., "Single- and Multi-Wall Carbon Nanotube Field-Effect Transistors", *Applied Physics Letters*, vol. 73, No. 17, pp. 2447-2449, Oct. 26, 1998.

Millman, J. et al., "Integrated Electronics: Analog and Digital Circuits and Systems", *McGraw-Hill Book Company*, pp. 322-328, 1972.

Onoa, G.B. et al., "Bulk Production of Singly Dispersed Carbon Nanotubes with Prescribed Lengths", *Nanotechnology*, vol. 16, pp. 2799-2803, 2005.

Radosavljevic et al., "Drain Voltage Scaling in Carbon Nanotube Transistors", *Applied Physics Letters*, vol. 83, No. 12, pp. 2435-2437, Dec. 22, 2003.

Radosavljevic et al., "High Performance of Potassium $n$-Doped Carbon Nanotube Field Transistors", *Applied Physic Letters*, vol. 84, No. 18, pp. 3693-3695, May 3, 2004.

Radoslavjevic, M. et al., "Nonvolatile Molecular Memory Elements Based on Ambipolar Nanotube Field Effect Transistors", *Nano Letters*, vol. 2, No. 7, pp. 761-764, 2002.

Rochefort, A. et al., "Switching Behavior of Semiconducting Carbon Nanotubes Under an External Electric Field", *Applied Physics Letters*, vol. 78, No. 17, pp. 2521-2523, Apr. 23, 2001.

Rueckes, T. et al., "Carbon Nanotube-Based Nonvolatile Random Access Memory for Molecular Computing", *Science*, vol. 289, pp. 94-97, Jul. 7, 2000.

Sapmaz, S. et al., "Carbon Nanotubes as Nanoelectromechanical Systems", *Physcial Review B.*, vol. 67, pp. 23514-1-23514-7, 2003.

Shim, M. et al., "Polymer Functionalization for Air-Stable n-Type Carbon Nanotube Field-Effect Transistors", *J. Am. Chem.*, vol. 123, pp. 11512-11513, 2001.

Stadermann, M. et al., "Nanoscale Study of Conduction Through Carbon Nanotube Networks," *Phys. Rev. B 69*, 201402(R), 2004.

Sze, S.M., "Physics of Semiconductor Devices", *John Wiley and Sons*, New York, pp. 431-438, 1981.

Wind, S. J. et al., "Vertical Scaling of Carbon Nanotubes Field-effect Transistors Using Top Gate Electrodes", *Applied Physics Letters*, vol. 80, No. 20, May 20, 2002.

Wind, S.J. et al., "Fabrication and Electrical Characterization of Top Gate Single-Wall Carbon Nanotube Field-Effect Transistors", *IBM T.J. Watson Research Center*.

Wind, S.J. et al., "Lateral Scaling in Carbon-Nanotube Field-Effect Transistors", *Physical Review Letters*, vol. 91, No. 5, pp. 058301-1-058301-4, Aug. 1, 2003.

Wind, S.J. et al., "Transistor Structures for the Study of Scaling in Carbon Nanotubes", *J. Vac. Sci. Technol. B*, vol. 21, No. 6, pp. 2856-2859, 2003.

Yoneya, N. et al., "Charge Transfer Control by Gate Voltage in Crossed Nanotube Junction", *Applied Physics Letters*, vol. 81, No. 12, pp. 2250-2252, Sep. 16, 2002.

Zhou, Y. et al., "p-Channel, n-Channel Thin Film Transistors and p-n Diodes Based on Single Wall Carbon Nanotube Networks", *Nano Letters*, vol. 4, No. 10, pp. 2031-2035, 2004.

* cited by examiner

PRIOR ART
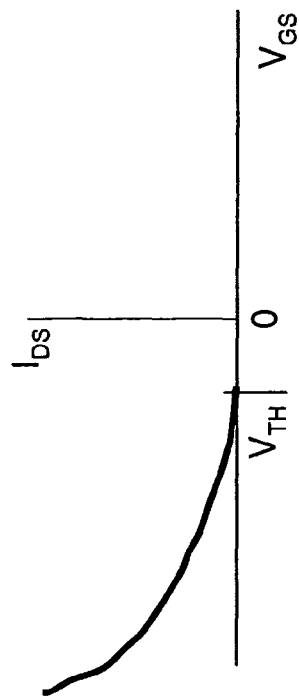
Fig 1A1
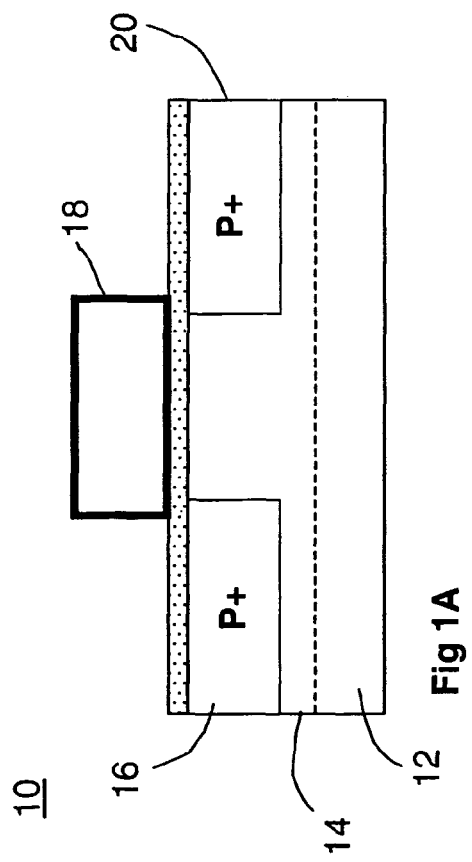
Fig 1A

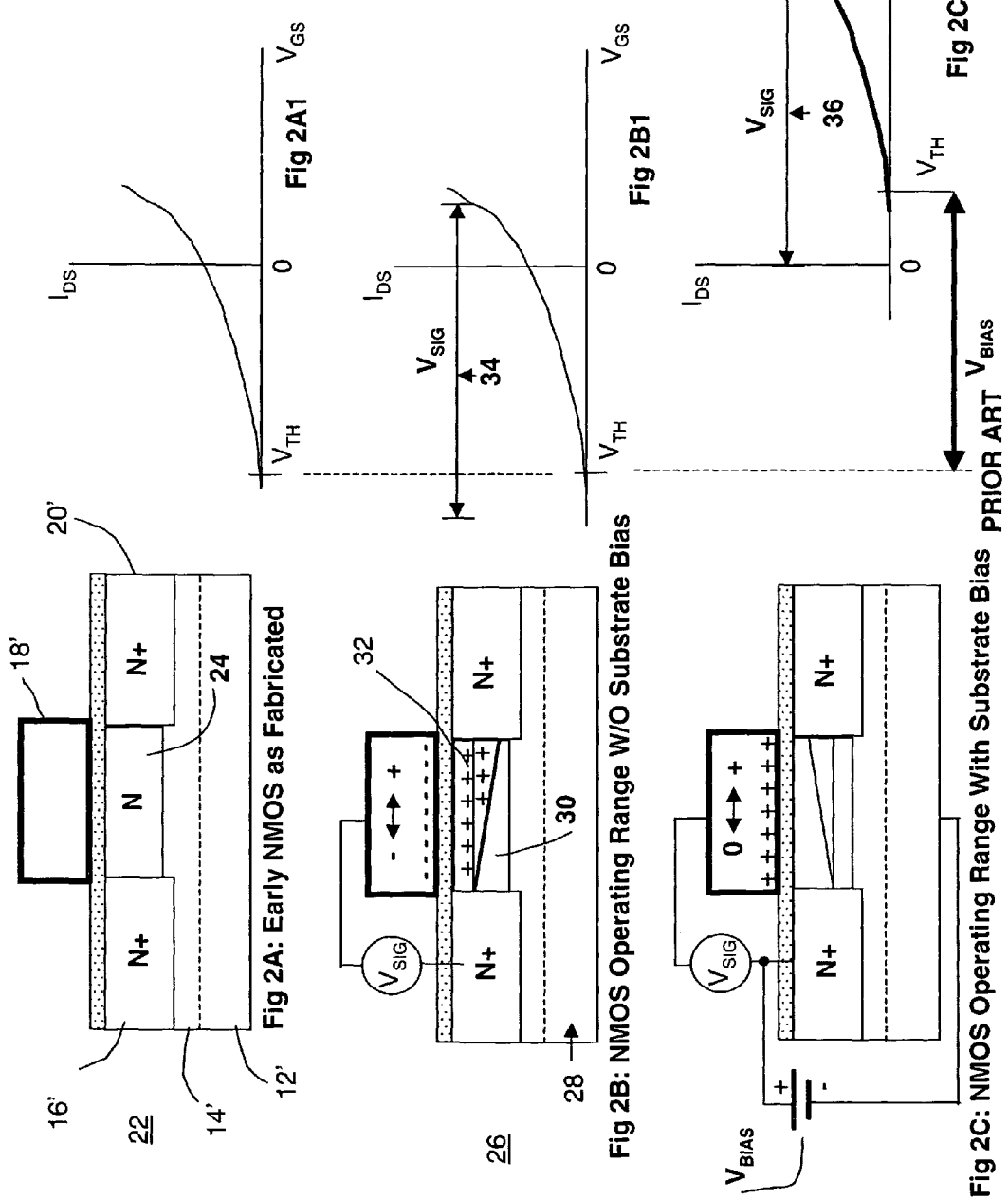

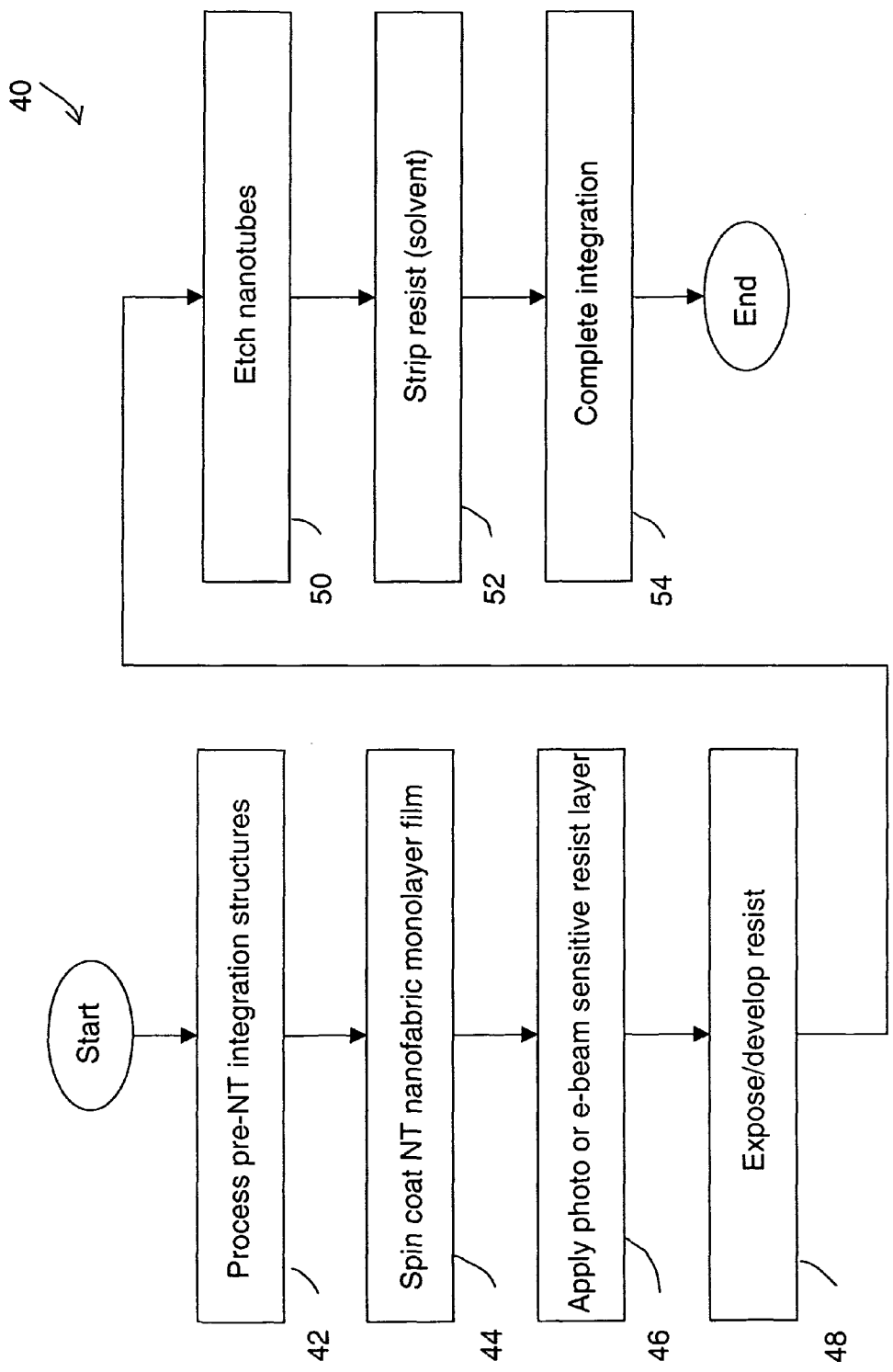
Fig 3: Methods of SWNT Nanofabric Deposition and Patterning

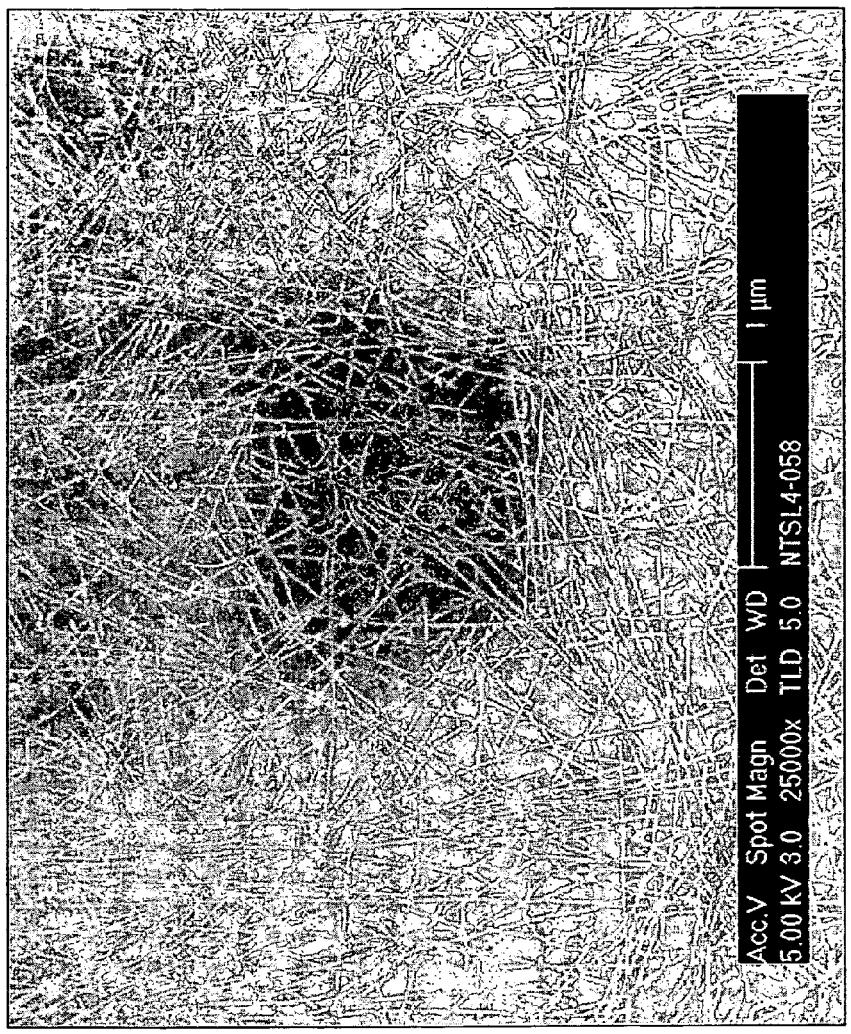
Fig 4: Deposited Non-woven SWNT Nanofabric
Batch 58;
1 spin R9
SR: 3.0-3.7 kohm

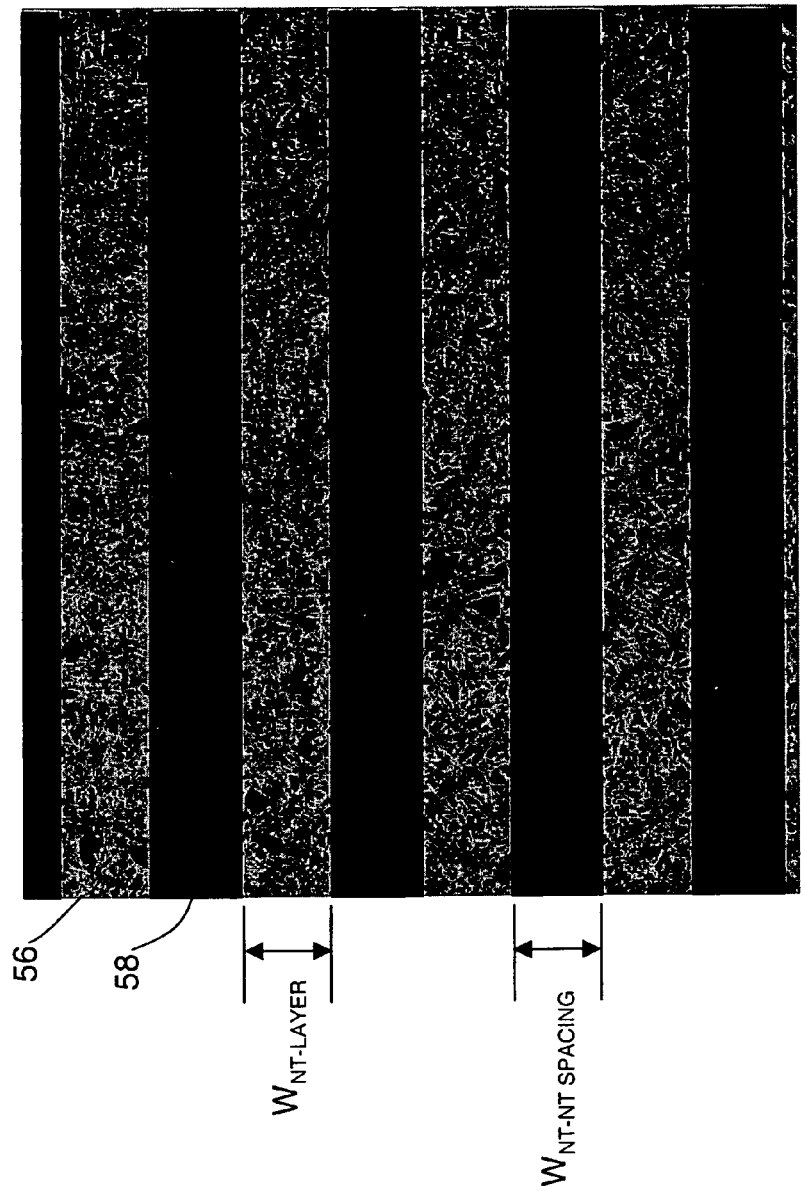
Fig 5: Patterned Non-woven SWNT Nanofabric

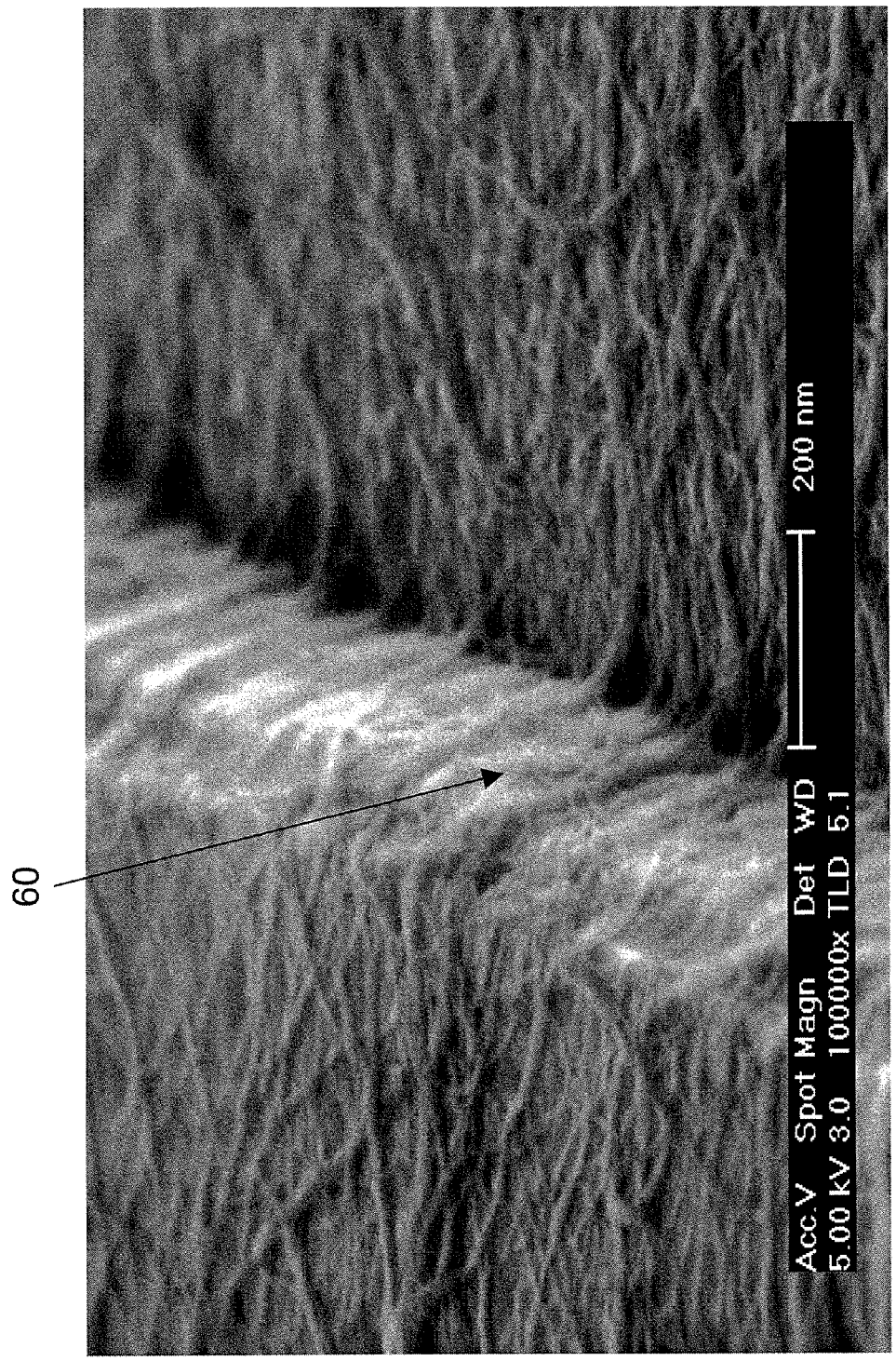
Fig 6: Deposited Non-woven SWNT Nanofabric Conforming to an underlying Step

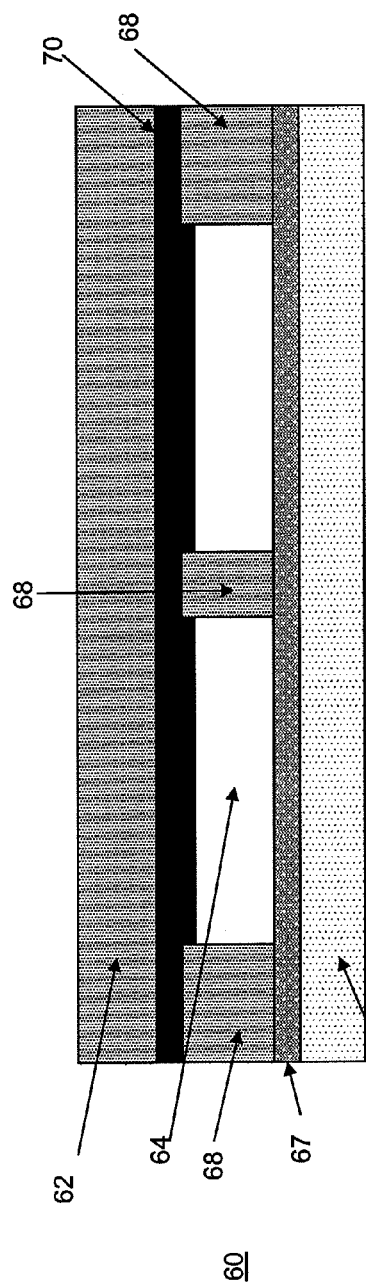
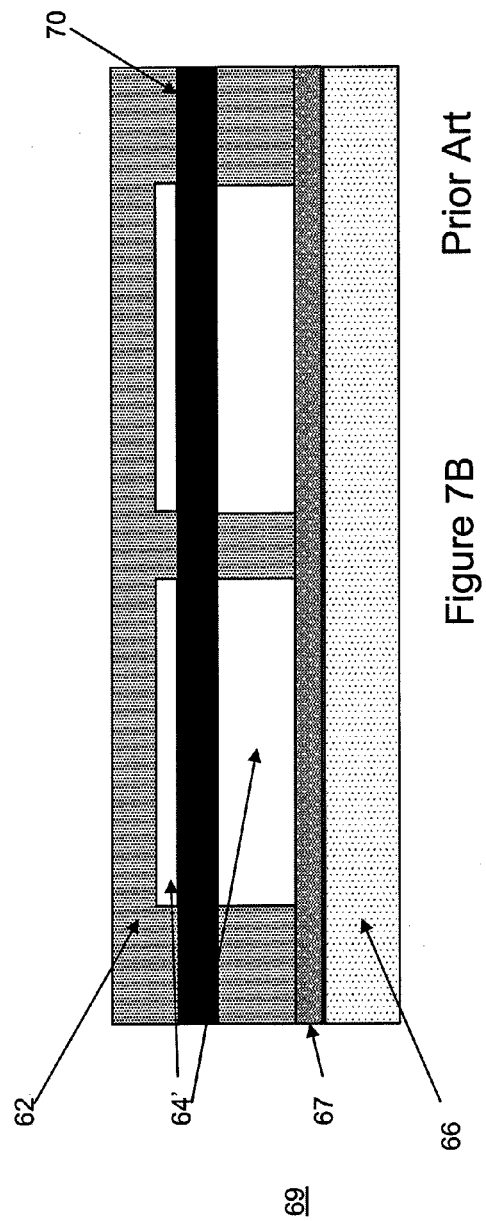
Figure 7A Prior Art
Figure 7B Prior Art

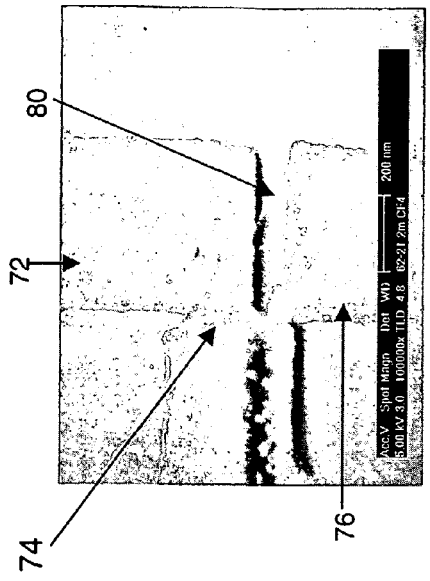
Fig 8A: Integrated SWNT Nanofabric with air dielectric; CNFET operation observed
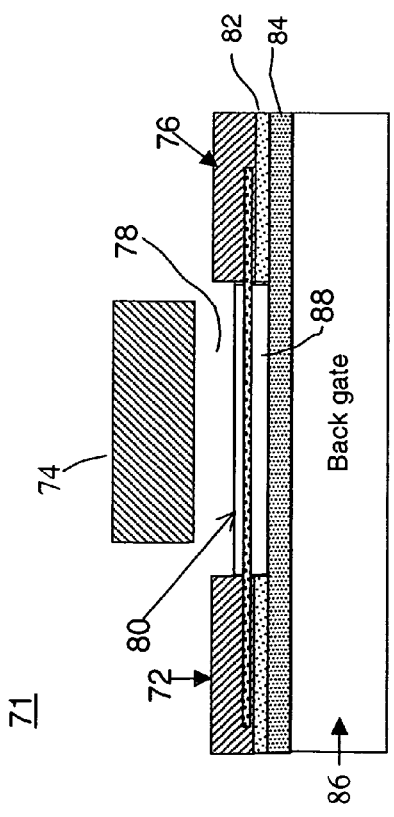
Fig 8B: Top gate (break-away) view
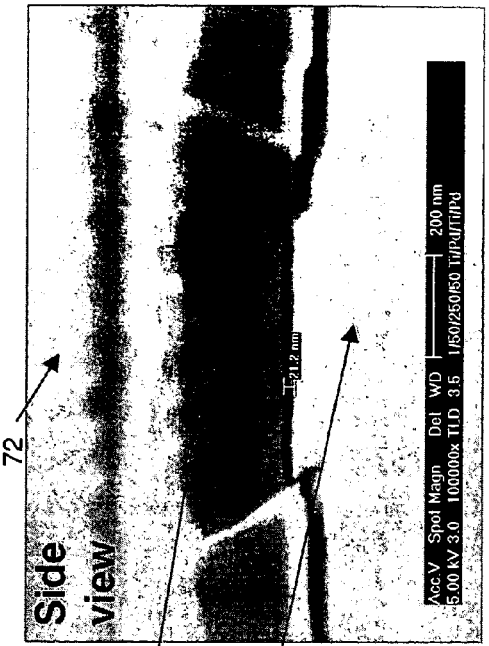
Fig 8C: Plan (top) view
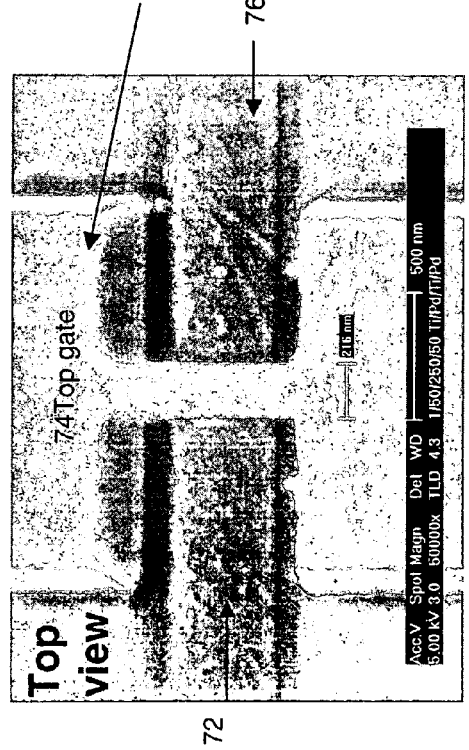
Fig 8D: Side view from drain contact side

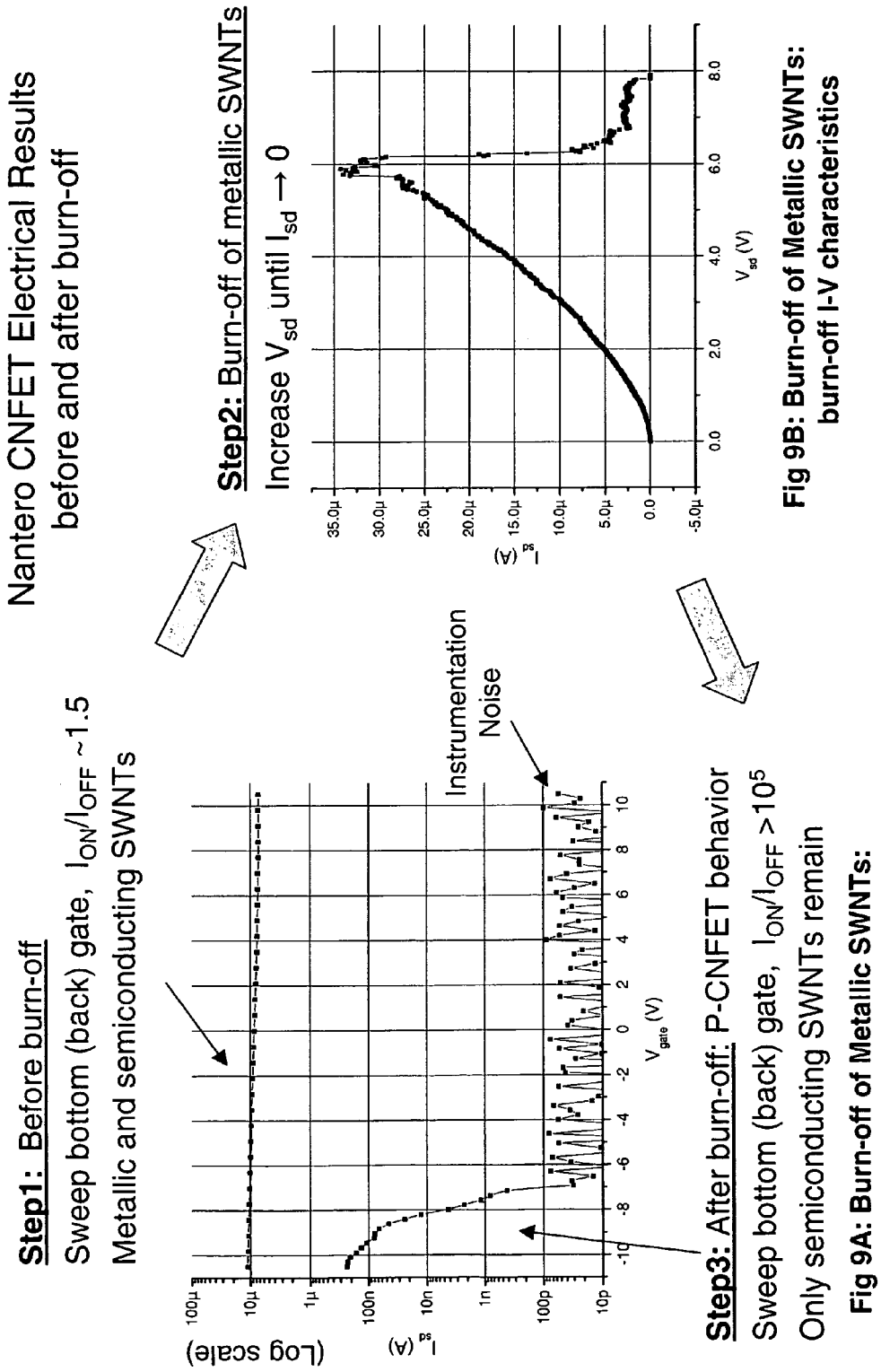
Fig 9A: Burn-off of Metallic SWNTs: before and after burn-off
Fig 9B: Burn-off of Metallic SWNTs: burn-off I-V characteristics

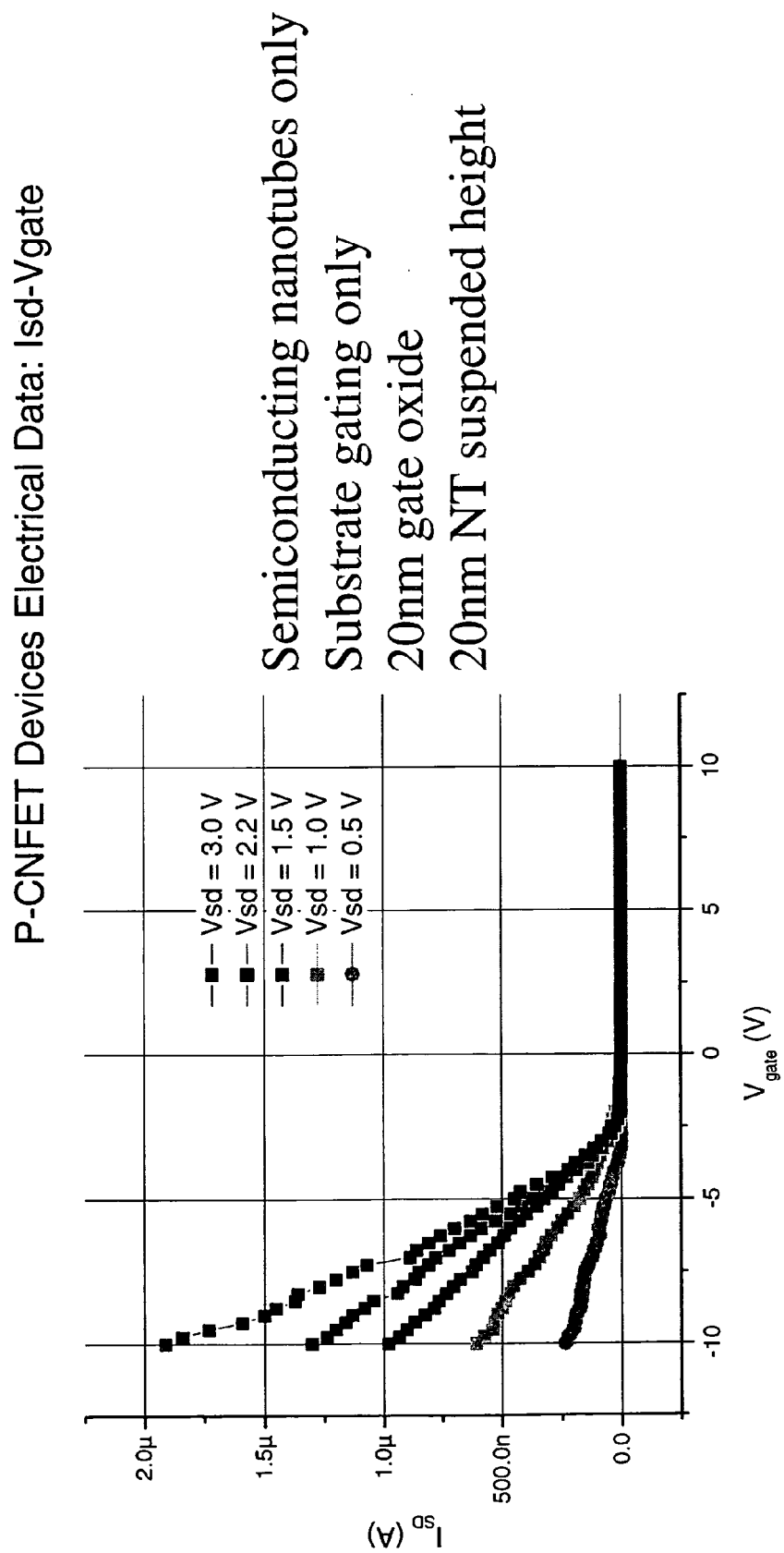
Figure 10A: Post Burn-off Integrated Patterned Semiconductor-only SWNT Nanofabric forms P- CNFETs normally OFF at Vgate = 0 volts

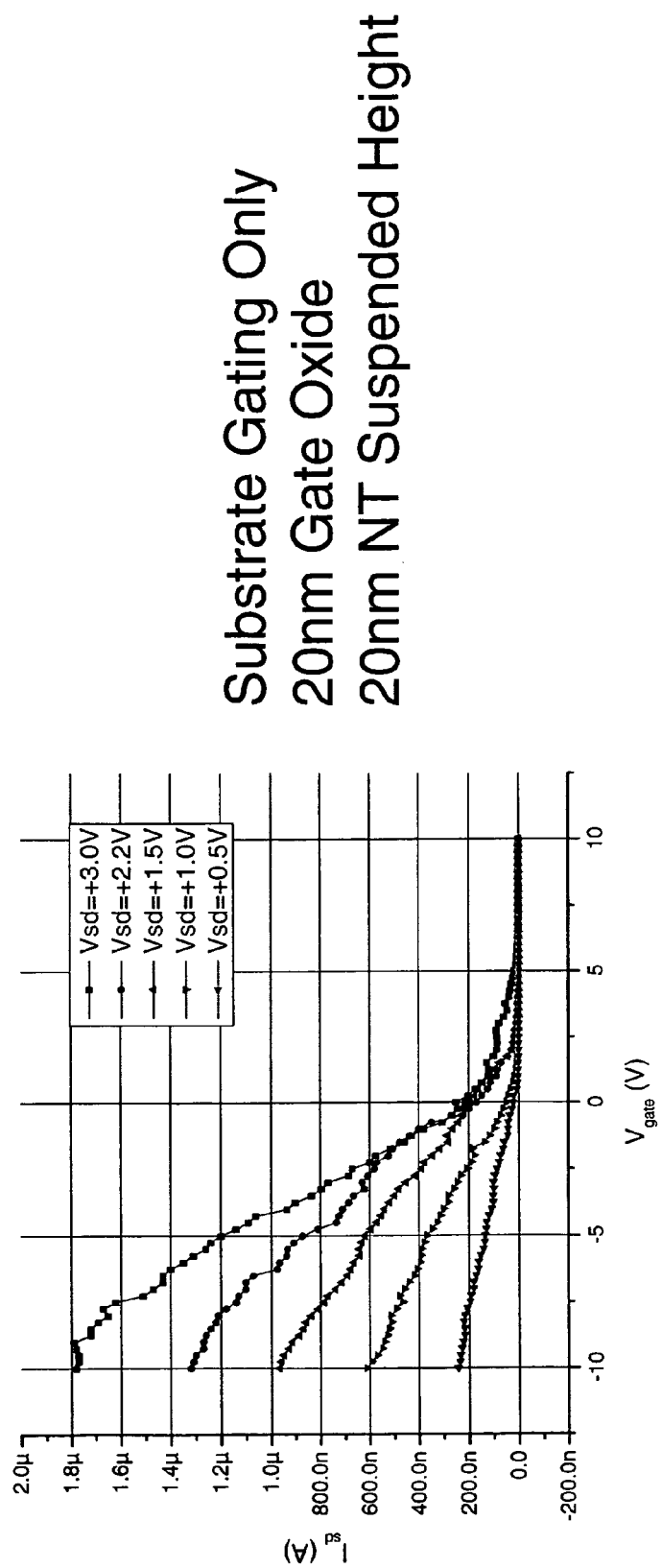
Figure 10B: Post Burn-off Integrated Patterned Semiconductor-only SWNT Nanofabric forms P- CNFETs normally ON at Vgate = 0 volts

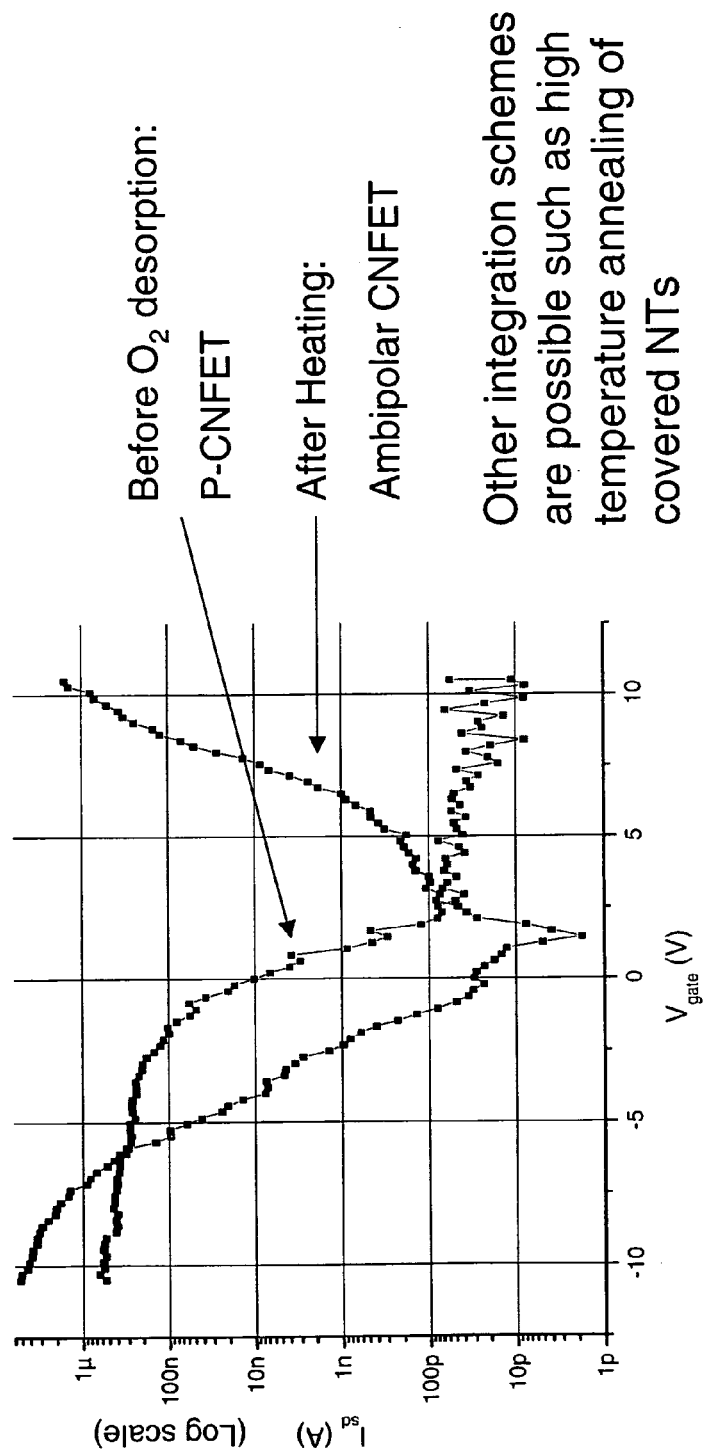
Figure 11: Post Burn-off Integrated Patterned Semiconductor-only SWNT Nanofabric forms Ambipolar CNFETs after additional processing (heating)

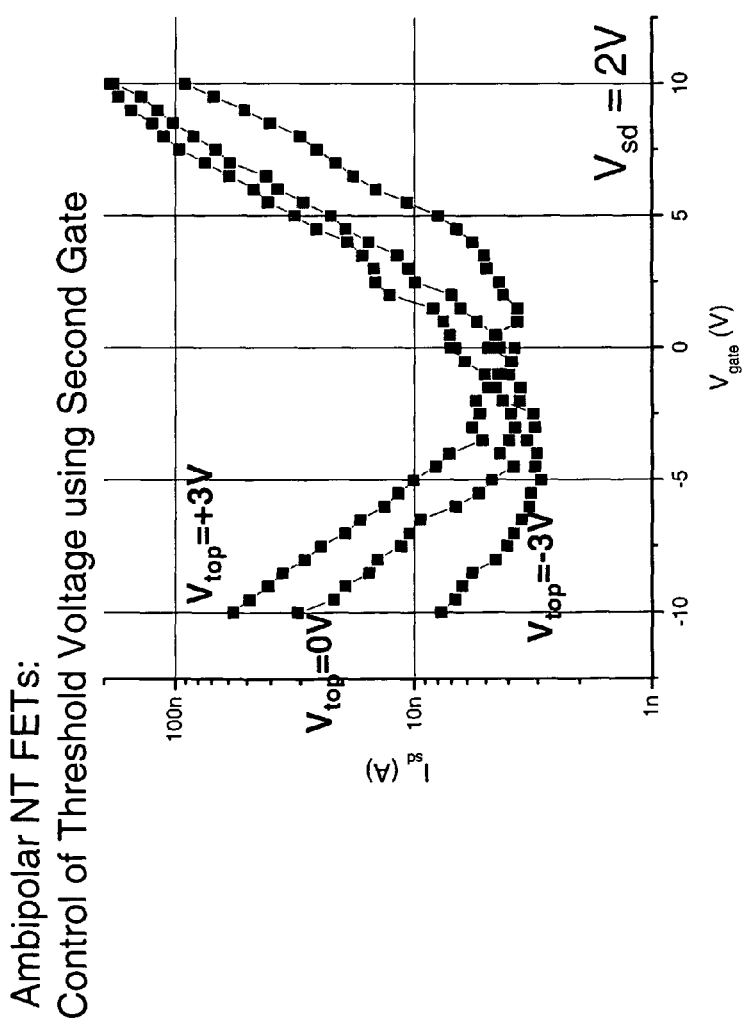
- Modulation of threshold voltage demonstrates top (upper) gate modulating the I-V characteristic
- Top-gate and bottom-gate can both be used to optimize device characteristics
Figure 12: Post Burn-off Integrated Patterned Semiconductor-only SWNT Nanofabric Ambipolar CNFETs illustrating dual gate control High-voltage high-current NFET (HV/HI NFET)

High-voltage high-current NFET (HV/HI NFET)

High-voltage high-current NFET (HV/HI NFET)

Figure 19 Methods Flow Chart - Burn-off before Top Gate Formation

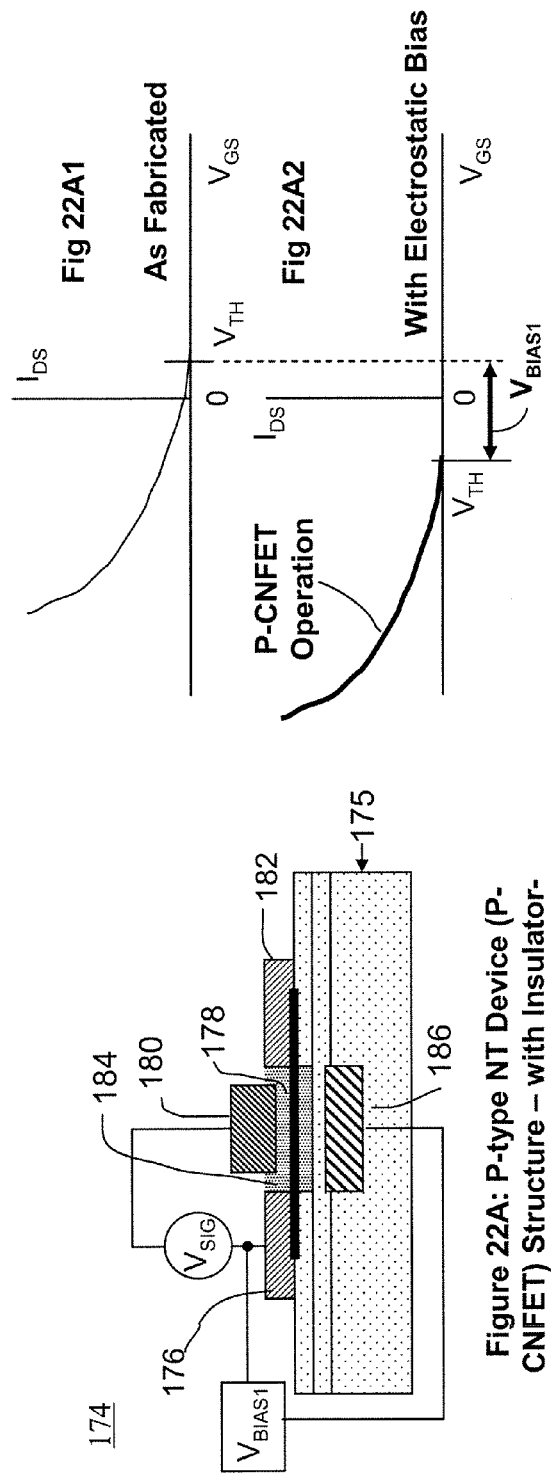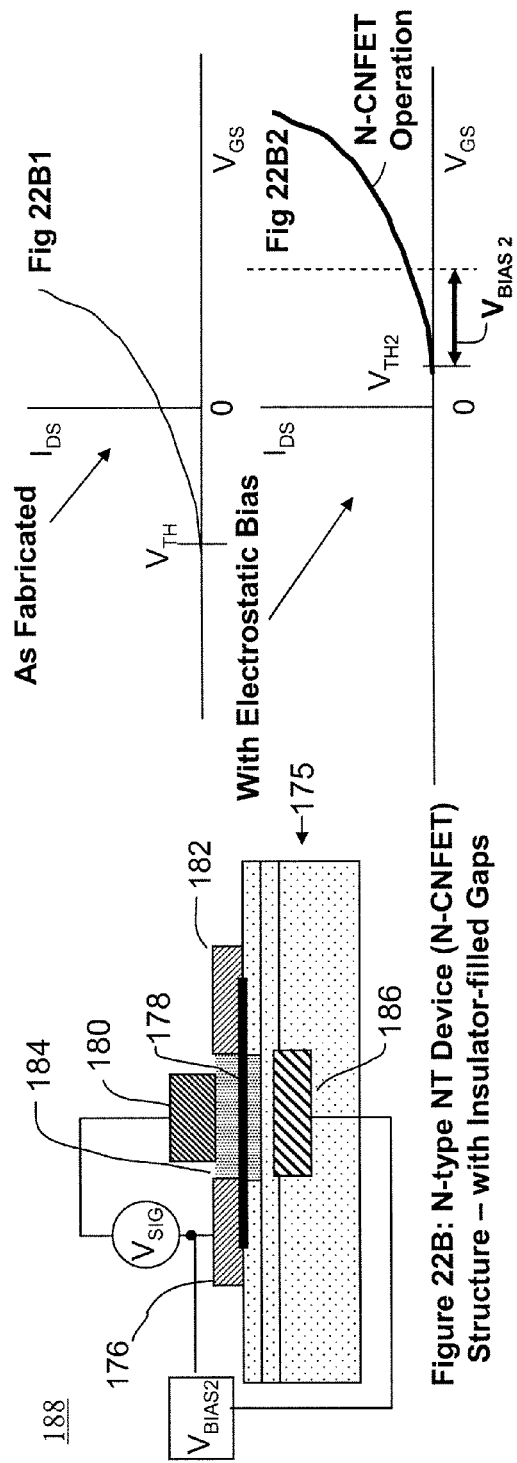
Figure 22A: P-type NT Device (P-CNFET) Structure – with Insulator-filled Gaps
Figure 22B: N-type NT Device (N-CNFET) Structure – with Insulator-filled Gaps

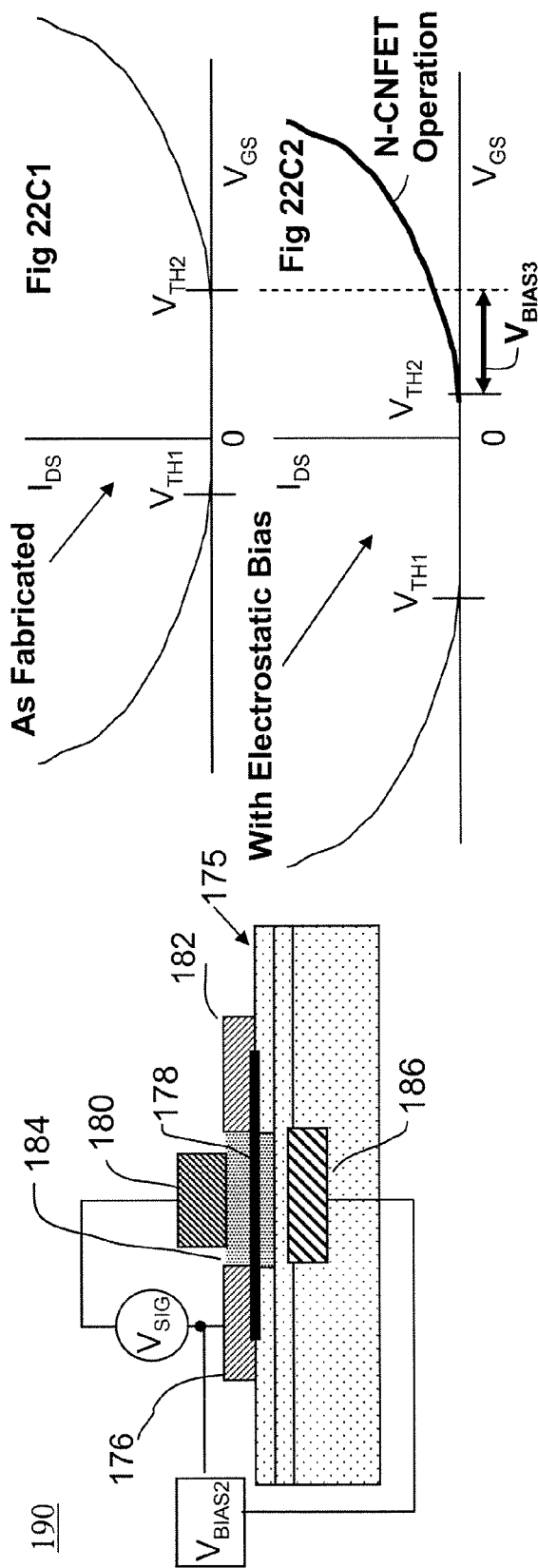
Figure 22C: Ambipolar-type NT Device Ambipolar-CNFET) Structure – with Insulator-filled Gaps

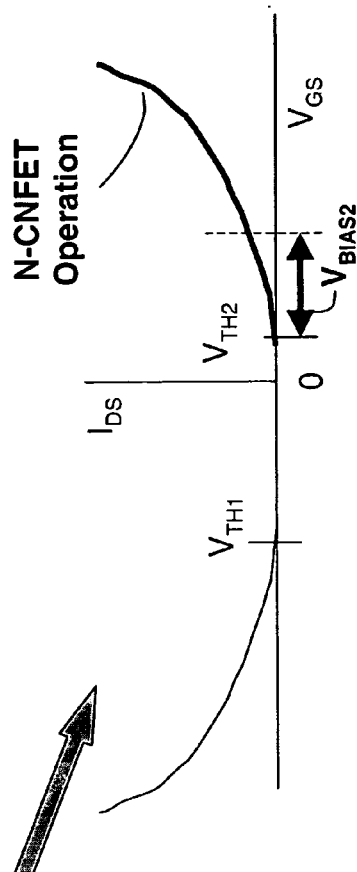
Fig 23A1: P-type NT Device I-V Characteristic
Fig 23A2: Ambipolar-type NT Device I-V Characteristic
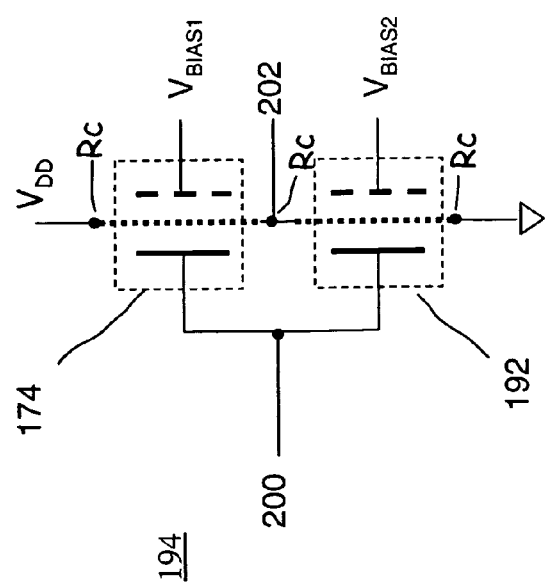
Fig 23A: Nanofabric Inverter

| CMOS process integrated | With 0.18um CMOS | With 0.13um CMOS |
|---|---|---|
| Voltage range requirements | | |
| Operating voltages | 1.6V to 2.0V | 1.0V to 1.5V |

| Comparable 0.13um 1.2V-1.5V CMOS technology is assumed | | | |
|---|---|---|---|
| Applications Requirements | Low power applications | Typical applications | High performance applications |
| Ron,max per um NFET width | About 2.4k ohms | About 1.7k ohms | About 1K ohms |
| Ron,max per um PFET width | About 4.8k ohms | About 3.4k ohms | About 2K ohms |
| Capacitance,max per um of NTFET width | About 3fF to 5fF | About 2fF to 4fF | About 1fF to 2 fF |
| Ring oscillator gate delay (no load) | 40ps to 80ps | 20ps to 40ps | Sub 10ps |

Table 1: Estimates of CNFET electrical characteristics needed for CNFET devices

Figure 24

FIELD EFFECT DEVICE HAVING A CHANNEL OF NANOFABRIC AND METHODS OF MAKING SAME

CROSS-REFERENCE OF RELATED CASES

This application claims the benefit under 35 U.S.C. §119 (e) of U.S. Provisional Patent Application No. 60/644,427, filed on Jan. 14, 2005, entitled Field Effect Device Having a Channel of Carbon Nanofabric and Method of Making Same, and U.S. Provisional Patent Application No. 60/644,641, filed on Jan. 18, 2005, entitled Hybrid Carbon Nanotubes FET (CNFET)-FET Static RAM (SRAM), the contents of which are hereby incorporated by reference in their entireties.

This application is related to U.S. patent application Ser. No. 11/332,080, filed on an even date herewith, entitled Hybrid Carbon Nanotubes FET (CNFET)-FET Static RAM (SRAM), the contents of which is hereby incorporated by reference in its entirety.

BACKGROUND

1. Technical Field

This invention relates in to a field effect device having an channel of carbon nanofabric and a method of making the same.

2. Discussion of Related Art

Scaling of CMOS FETs is increasingly difficult, even at the 90 nm technology node, with high leakage currents resulting in high standby power dissipation at short channel lengths due to well-known problems associated with scaling FET devices threshold voltages. In large measure this scaling problem is caused by the difficulty in gate control of the electrical characteristics of the FET channel region in the silicon substrate. The problem is expected to get much worst as technology dimensions shrink to 65 nm, 45 nm, and 20 nm values. There is concern that scaling below 20 nm using silicon substrates may become impractical from both technical feasibility and a fabrication cost perspectives.

The operating principle of the metal oxide semiconductor field effect transistors, (MOSFETS) is very well understood; see S. M. Sze, Semiconductor Devices: Physics and Technology (John Wiley and Sons, New York, 1985. In general, a field effect transistor has a source region, a drain region and a channel region disposed between the source and drain. The conductivity of a region of semiconducting material of the channel is modulated by an adjacent, electrically isolated structure (the gate). When the gate is electrically charged, a conduction pathway in the semiconductor is either created or eliminated which is the basis of an electrically controlled switch. FETs form the basis for logic, memory and analog applications in the electronics industry. The industry strives to fabricate these devices such that they can operate faster, consume less power and consume less space: the latter leads to greater functionality for a given surface area.

Smaller FETs than those made using silicon based sources, drains and channels have been proposed which utilize individual carbon nanotubes, either doped or undoped, as channel regions. See Derycke, V. et al., "Carbon Nanotube Inter- and Intramolecular Logic Gates," Nano Letters, Vol. 1 No. 9, 453-456. Such channel region nanotubes must be individually placed between sources and drains, and therefore the fabrication of a single ultra dense array would be prohibitively time consuming if not impossible.

Currently there are nanotube-based FET devices under development at various academic laboratories. Devices reported in the literature include thin dielectric layers to maximize gate coupling to the nanotube. See 2. V. Derycke, et al., Controlling doping and carrier injection in carbon nanotube transistors, Applied Physics Letters, Vol. 80, No. 15, Apr. 15, 2002, A. Javey, et. al., High-k Dielectrics for Advanced Carbon-nanotube Transistors and Logic Gates, from a nature materials Online Publication, Nov. 17, 2002 and S. J. Wind, J., et al., Vertical scaling of carbon nanotubes field-effect transistors using top gate electrodes. Applied Physics Letters, Vol. 80, No. 20, May 20, 2002.

One of the problems with current fabrication techniques is that there does not exist a method for consistently aligning one or more nanotubes (NTs) with other components of a given device.

Research has shown that individual (single) semiconducting single-walled nanotubes (SWNTs) exhibit high electron and hole mobility (higher than those in silicon substrates) and reduced short channel effects, see Seidel, Nano Letters Chen, J., "Self-Aligned Carbon Nanotube Transistors with Novel Chemical Doping," IEEE 2004; Lin, Y.-M., "Novel Carbon Nanotube FET Design with Tunable Polarity," IEEE 2004; Avouris, Ph., et al., "Carbon Nanotube Electronics and Optoelectronics," IEEE 2004; Guo, J., et al., "Carbon Nanotube Field-Effect Transistors with Integrated Ohmic Contacts and High-K Gate Dielectrics," Javey, A. et al., "Carbon Nanotube Field-Effect Transistors With Integrated Ohmic Contacts and High-k Gate Dielectrics," Nano Lett. 2004, Vol. 4, No. 3, 447-450. Reduced short channel effects are likely due to the surface conduction of the SWNT fibers. That is, the FET channel remains at the surface of the SWNT fiber. While research has demonstrated individual (single) semiconducting SWNT operation for P-type, N-type, and Ambipolar-type FET devices, useful carbon nanotube FET (CNFET) devices must be optimized and integrated into a process flow that includes placement, patterning, and wiring of CNFET devices. CNFET devices may have a selectable number multiple SWNTs in parallel for increase current flow and higher performances required for product design. Since both metallic and semiconducting SWNTs are present when using nanotube wafer-growth techniques or wafer spin-on techniques, it is necessary to selectively eliminate metallic SWNT from the CNFET devices. Finally, the electrical characteristics of the CNFET devices must be optimized for operation in the voltage range required for product design.

Prior Art Dual-Gate FET Device Operation and Characteristics:

In the mid to late 1960's, PMOS-based products with non-self-aligned aluminum gates became available. PMOS had the advantage that when fabricated the devices were in the normally OFF state, with no channel between the P+ source—drain regions. PMOS devices had negative threshold voltages and operated between ground and minus $V_{DD}$ ($-V_{DD}$). Threshold voltages were high, $-5$ volts for example, and $V_{DD}$ applied voltages were in the $-12$ to $-20$ V range. Also, the mobility was 2.5 to 3× lower than NMOS mobility. Threshold voltages were reduced with PMOS device scaling. The difference in mobility between PMOS and NMOS devices remain due to the relative mobilities of p-type and n-type carriers in the FET channel region. FIGS. 1A and 1A1 show a cross section of a prior art PMOS FET (PFET) 10 and associated I-V characteristic.

There was strong interest in using N-type FETs because of much lower NMOS channel resistance for the same geometries due to the superior electron mobility, 2.5 to 3× higher than PFET hole mobility. Bipolar circuits (TTL) were operating at positive 5 volts power supply so there was strong interest in FET products operating with positive 5 volt power supply for ease of mixing new FET-based products with the existing bipolar technology. A major problem was that NMOS devices were in the ON state as fabricated. Positive ions both fixed and mobile, combined with the work function of the aluminum gate and p-substrate doping, plus defects in the $Si/SiO_2$ interface made it impossible to find a fabrication-only solution to the fabricated normally-ON NMOS problem (it took well over 10 years to find a fabrication-only solution). Products designers needed a way to use normally-ON NMOS FETs or remain with an inferior P-type FET technology. The NFET problem of these prior art devices is described in the text book by J. Millman & C. Halkias, "Integrated Electronics: Analog and Digital Circuits and Systems," McGraw-Hill Book Company, 1972, pages 322-328.

Prior art FIG. 2A shows the cross section of early NMOS devices normally ON as fabricated and associated I-V characteristics in FIG. 2A1, with the NMOS having a negative threshold voltage. Prior art FIG. 2B cross section and associated FIG. 2B1 show the operation of the device using a signal $V_{SIG}$ applied between source S and gate G. The gate to source voltage must be negative to modulate the channel region to eliminate a depletion region between the channel the surface ($Si-SiO_2$ interface). This method of operation could not meet the requirement of operating voltages in the zero to $V_{DD}$ range, with a positive threshold voltage. Prior art FIG. 2C cross section and associated FIG. 2C1 I-V characteristics shows the effect of introducing a substrate bias voltage $V_{BIAS}$ that is used to electrostatically alter the electrical properties of the channel region. Using the substrate as common back-gate biased negative with respect to NFET source diffusions, the normally-ON FET channel resulting from process-only fabrication techniques was turned OFF and NFET threshold voltage was set using electrostatic coupling in the depletion region between the substrate region and the channel region. The electrical I-V characteristic of FIG. 2B1 was translated to the electrical characteristic shown in FIG. 2C1 using $V_{BIAS}$. The NFET gate G voltage operating range for NFET product design was in the 0 to 5 volt range (5 volt power supply compatible), achieved using a combination of process (chemical) means and electrostatic (electrical) means as illustrated in prior art FIG. 2C. Signal $V_{sig}$ may now operate in the positive 0 to 5 volts range, for example.

SUMMARY

The invention provides field effect devices having channels of nanofabric and methods of making same.

Under one aspect of the invention, a nanotube field effect transistor is made to have a substrate, and a drain region and a source region in spaced relation relative to each other. A channel region is formed from a fabric of nanotubes, in which the nanotubes of the channel region are substantially all of the same semiconducting type of nanotubes. At least one gate is formed in proximity to the channel region so that the gate may be used to modulate the conductivity of the channel region so that a conductive path may be formed between the drain and source region.

Under another aspect of the invention, forming a channel region includes forming a fabric of nanotubes in which the fabric has both semiconducting and metallic nanotubes and the fabric is processed to remove substantially all of the metallic nanotubes.

Under another aspect of the invention, the fabric is processed by subjecting it to electrical stimulation so as to fail substantially all of the metallic nanotubes.

Under another aspect of the invention, the fabric is electrically biased so as to turn off the conductivity of the semiconducting nanotubes before subjecting the fabric to electrical stimulation to fail the metallic nanotubes.

Under another aspect of the invention, the fabric is formed to be a suspended fabric with a gap on at least one side of the fabric to facilitate the failing of the metallic nanotubes.

Under another aspect of the invention, the nanotubes of the channel region are processed to be substantially all ambipolar semiconducting nanotubes.

Under another aspect of the invention, the substrate is an active substrate including circuitry therein that may be used to electrically stimulate and fail the metallic nanotubes.

Under another aspect of the invention, the circuitry to electrically stimulate and fail the metallic nanotubes operates before completion of the formation the at least one gate.

Under another aspect of the invention, a nanotube field effect transistor includes a front gate and a back gate in proximity of the channel region, in which the back gate may be used to bias the transistor to translate a current voltage relationship of the transistor to a desired range and the front gate may be used to modulate the conductivity of the channel region.

Under another aspect of the invention, a nanotube logic circuit includes at least a first nanotube field effect transistor and a second nanotube field effect transistor interconnected so as to form a logic circuit. The channel region of the first nanotube field effect transistor is comprised of a first type of semiconducting nanotube and the channel region of the second nanotube field effect transistor is comprised of a second type of semiconducting nanotube, different than the first type.

BRIEF DESCRIPTION OF THE DRAWING

In the Drawing,

FIGS. 1A and 1A1 illustrate a cross section of a prior art PMOS FET (PFET) and associated I-V characteristic, respectively;

FIGS. 2A, 2A1, 2B, 2B1, 2C and 2C1 illustrate a cross sections of a prior art NMOS devices and associated I-V characteristics respectively;

FIG. 3 describes a basic method 40 of fabricating preferred embodiments of the invention;

FIG. 4 illustrates a single layer of spun-on nanotubes;

FIG. 5 illustrates a patterned nanofabric layer according to one aspect of the invention;

FIG. 6 illustrates highly conformal nanofabric layers;

FIGS. 7A and 7B illustrate prior art architectures;

FIG. 8A illustrates a cross section of a device according to one aspect of the invention;

FIGS. 8B-8D are micrographs of devices according to aspects of the invention;

FIGS. 9A-9B illustrate burn-off of the metallic SWNTs according to one aspect of the invention;

FIGS. 10A and 10B illustrate I-V characteristics of structures according to certain aspects of the invention;

FIG. 11 illustrates the conversion of a P-CNFET shown in FIG. 8 to an Ambipolar-CNFET;

FIG. 12 illustrates control of the I-V characteristic in the channel region of a structure according to aspects of the invention;

FIGS. 22A, 22A1, 22A2, 22B, 22B1, 22B2, 22C, 22C1 and 22C2 illustrate a device according to aspects of the invention along with I-V characteristic curves;

FIGS. 23A, 23A1, and 23A2 illustrate a device according to aspects of the invention along with I-V characteristic curves; and FIG. 24 is a table illustrating typical resistance values and parasitic capacitance targets for applications with requirements ranging from low power to high performance.

DETAILED DESCRIPTION

Integrating SWNTs and CMOS Processes

Preferred embodiments of the present invention provide a fabrication solution to the controlled placement, patterning, and wiring of CNFET devices to enable the design of logic and memory products using CNFET devices. Preferred embodiments provide a means of burning-off metallic SWNTs in the CNFET channel region such that only semi-conducting SWNTs remain. In addition, preferred embodiments of the present invention improve the electrical characteristics of the CNFET devices and ensure operation in the voltage range required for logic and memory products.

Preferred embodiments provide a process and design scheme that is manufacturable and that can yield a FET that has electrical characteristics that outperform the figures of merit of current and future state-of-the-art semiconductor-based transistors.

The current device layout is similar to that of the 3-terminal NRAM device. The FET properties represent a new operational mode for this device. Devices that use a single SWNT as a channel are described elsewhere, (see P. G. Collins, et al., *Engineering carbon nanotubes and nanotube circuits using electrical breakdown*, Science, V 292, pp. 706-712, 2001, and V. Derycke; A. Javey; S. J. Wind, cited above).

The operation of the device of preferred embodiments is similar to that of a standard Si-based FET with at least one primary difference: the implementation of suspended semi-conducting single-walled carbon nanotubes (s-SWNT) in place of a doped Si-channel. The preferred embodiments provide a device geometry that greatly improves manufacturability of NTFETs in that the nanotubes used in the present invention do not require alignment. Other embodiments (including partially suspended and non-suspended) are discussed below.

FIG. 3 describes a basic method 40 of fabricating preferred embodiments of the invention. The following paragraphs describe methods with respect to fabricating certain exemplary carbon nanotube FET (CNFET) device structures where semiconducting SWNTs form a channel region for CNFET devices, replacing silicon substrates used for conventional FET devices.

Figure 13A:
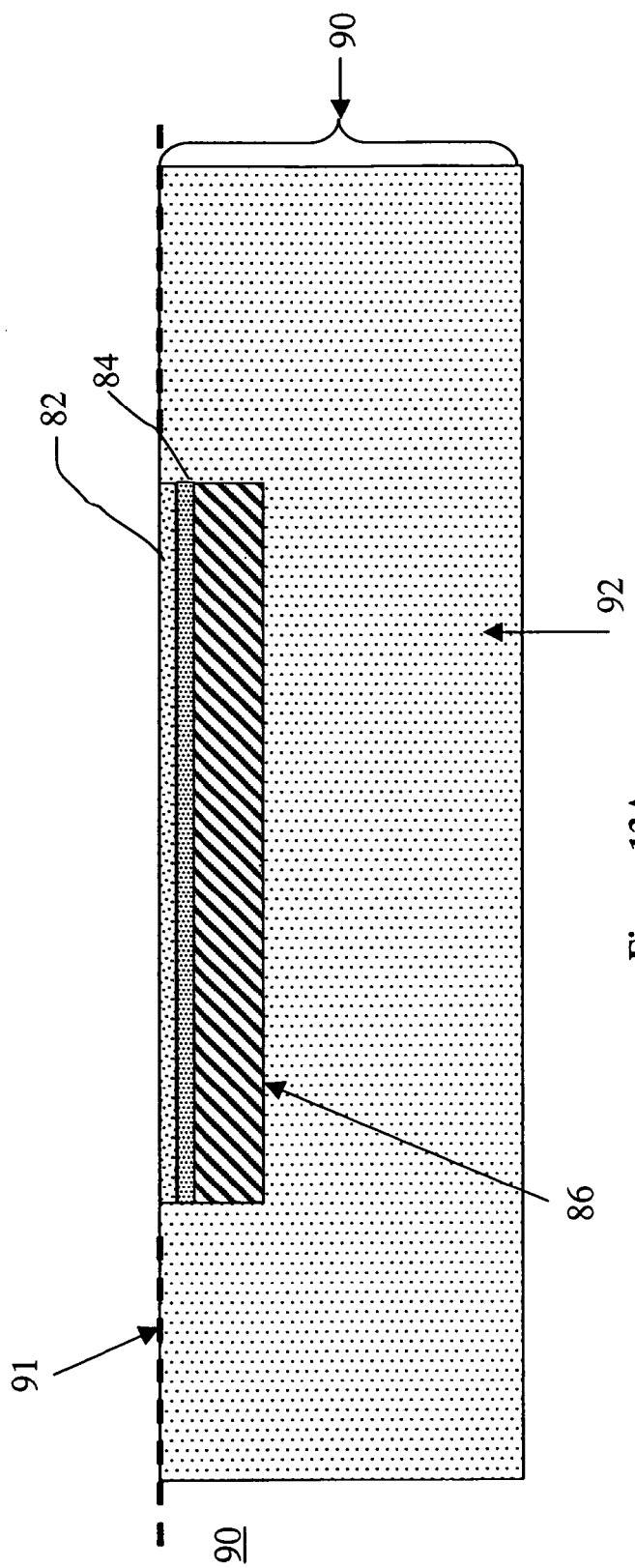
FIGS. 13A-13D illustrate intermediate structures according to aspects of the invention.
Figure 15A:
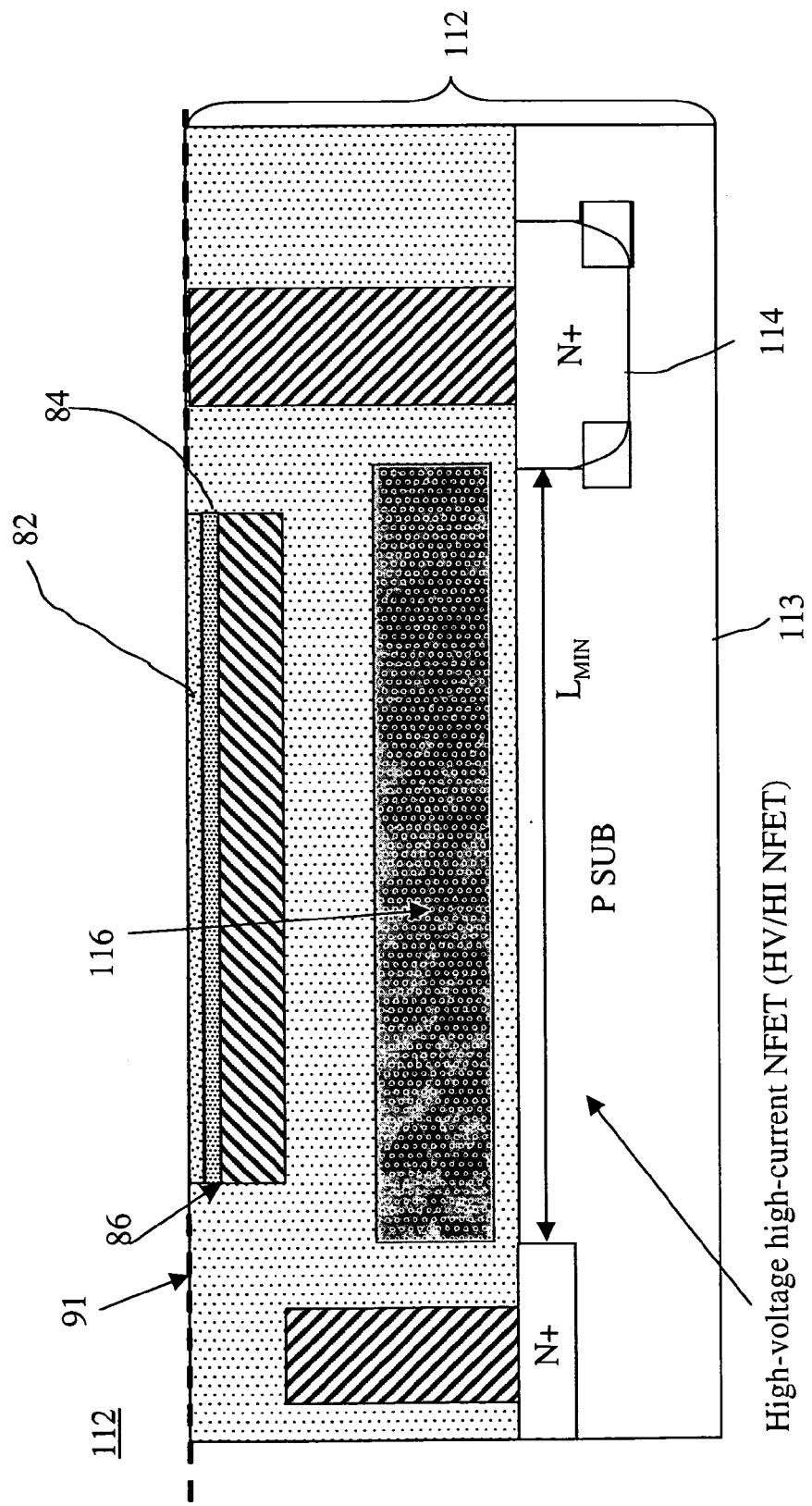
FIGS. 15A-15E illustrate intermediate structures according to aspects of the invention.

In general, preferred methods form 42 pre-nanotube integration structures using known techniques and thus are not described here. In this invention, two pre-nanotube integration structures are used: a first pre-NT integration structure that does not include active devices and is illustrated in FIG. 13A; and a second pre-NT integration structure that includes active devices and is illustrated in FIG. 15A. The active FET devices illustrated in FIG. 15A are designed to be high-voltage and high-current compatible devices to assist in metallic SWNT burn-off as described further below. However, conventional FET devices may also be included in the second pre-NT integration structure for use with CNFET devices stacked above to form hybrid functions using combinations of FET and CNFET devices.

Next, preferred methods 44 form a layer of matted carbon nanotubes, referred to as a nanofabric layer. This may be done with spin-on technique or other appropriate technique as described in U.S. Pat. Nos. 6,574,130, 6,643,165, 6,706,402, 6,784,028, 6,835,591, 6,911,682, 6,919,592, 6,924,538 and 6,942,921, and U.S. patent application Ser. Nos. 10/341,005, 10/341,054, 10/341,055, 10/341,130, 10/774,682, 10/776,059, 10/860,334, 10/860,433, 10/864,186, 11/007,752, 11/010,491, and 60/636,673, the contents of which are hereby incorporated by reference in their entireties (herein the "incorporated patent references"). Under preferred embodiments, the carbon nanotube layer has a thickness of approximately 0.5-5 nm for devices using single-walled nanotubes and 5-20 nm and greater for devices using multi-walled nanotubes.

FIG. 4 illustrates a single layer of spun-on nanotubes. Multiple layers of nanotubes may be spun-on. Nanofabric layer thickness is typically in the range of 0.5 to 5 nm for SWNT layers, and 5 to 20 nm thick for MWNT layers. The resistivity of the spun-on nanotubes may be controlled in the range of 500 to 10,000 ohms per square, for example, as measured by four-point probe measurements. The nanotube layer consists of non-woven metallic and semiconducting SWNT fibers as described in the above references. Burn-off measurements of deposited fibers described further below indicate a typical mix of 2 semiconducting SWNTs for every 1 metallic SWNT. For CNFET devices of preferred embodiments, metallic SWNTs are burned-off in the channel region as described further below. Such burn-off techniques while suitable for the devices described herein may be obviated through a variety of other means, primarily through the use of solely semiconducting SWNTs. The inventors have foreseen that purified semiconducting SWNTs as well as purified metallic nanotubes may be available for bulk usage and would become a preferred embodiment for a CNFET. Such semi-conducting SWNTs would make the process of doping to generate n- or p-type semiconducting SWNTs substantively more facile as can be seen by those skilled in the art.

At this point in the process, a metallic contact layer may be deposited on the nanotube fabric layer. The contact layer may be patterned and act as a masking layer for etching the nano-tube nanofabric layer. This method is described in U.S. patent application Ser. No. 10/864,186 entitled, "Non-volatile Electromechanical Field Effect Devices and Circuits using same and Methods of Forming Same." Alternatively, the nanotube layer may be patterned first as illustrated in method 40, FIG. 3, followed by contacts to the patterned nanotube layer.

Next, preferred methods 46 apply a photo or e-beam sensitive resist layer, for example, using known industry techniques.

Next, preferred methods 48 expose and develop the resist layer in a desired pattern using a masking layer and optical exposure, or direct-write e-beam, or other suitable means following standard industry practices.

Next, preferred methods 50 etch the nanofabric layer defining the desired pattern using industry standard techniques. Ashing may be used, for example.

Next, preferred methods 52 strip (remove) the resist using an industry standard solvent. The resulting patterned nanofabric layer 56 along with the patterned nanofabric spacing 58 is illustrated in FIG. 5. The nanofabric layer illustrated in FIG. 5 is planar and is used to define planar CNFET devices as shown further below. However, nanofabric layers are highly conformal, as illustrated in FIG. 6. Although not shown in this invention, the conformal properties of nanofabrics may be used to fabricate CNFET devices with a vertical orientation, with channel lengths defined by the insulator step 60 illustrated in FIG. 6, for example.

Next, preferred methods 54 complete the integration of the device as explained further below.

Nanofabric Metallic SWNT Burn-off

U.S. Pat. Nos. 6,141,245, 6,219,215 and 6,243,283 to Bertin et al. illustrate conductor burn-off in selected portions of a patterned conductive layer. A gap 64 is introduced below a portion of the patterned conductive layer 70 as illustrated in prior art FIG. 7A, or below and above 64' a portion of the patterned conductive layer as illustrated in prior art FIG. 7B. The gap 64 (or 64') substantially reduces thermal flow between the patterned conductor layer and a thermal sink such a substrate layer, a portion of the conductor in the gap region is vaporized when current is passed through the patterned conducting layer, and the conducting path is interrupted as explained in U.S. Pat. Nos. 6,141,245, 6,219,215 and 6,243,283. The technique illustrated in FIG. 7 may be adapted to eliminate metallic SWNTs in the channel region of a CNFET device formed using the patterned nanofabric illustrated in FIG. 5. This was confirmed experimentally as described with respect to FIG. 8 and as further discussed below. Nanofabric width $W_{NT\text{-}LAYER}$ may vary from 200 to 300 nm to dimensions as small of less than 20 nm, for example. Nanofabric spacing $W_{NT\text{-}NT\ SPACING}$ may vary from 200 to 300 nm to dimensions as small of less than 20 nm, for example.

FIGS. 8A-8D illustrate a structure 71 fabricated on a silicon substrate used as a bottom (back) gate 86, with insulator 84 of about 20 nm thickness, and a gap 88 between insulator 84 and the NT channel 80 of approximately 20 nm. Source and drain contacts 72, 76 to the SWNTs forming the NT channel region 80 may be formed using Ti, Pd, W, combinations of these and other metals such as aluminum, copper, and other conductors. The NT channel 80 suspended length may be in the range of 200 to 300 nm, for example. SWNT fibers in the patterned nanofabric layer of FIG. 5 are typically in the range of 1 to 4 um in length, for example. Thus, the conductive layer 80 between source and drain contacts 72, 76 consists of suspended semiconducting and metallic SWNTs. More specifically, experiments were carried out with fully suspended and partially suspended semiconducting and metallic SWNTs between the source and drain contacts. In the case of fully suspended SWNTs, semiconducting and metallic SWNTs were only in contact with the source and drain electrodes, with SWNTs suspended in the vicinity of source and drain regions, but in physical contact with a portion of an underlying dielectric layer. Both types of devices exhibited similar electrical characteristics. The structure illustrated in FIG. 8 also has a front (top) gate 74 separated from the NT channel 80 by a gap 78 in the range of 30 to 60 nm. Structures similar to those illustrated in FIG. 8 are described in more detail in U.S. patent appliation Ser. No. 10/864,186 entitled, "Non-volatile Electromechanical Field Effect Devices and Circuits using same and Methods of Forming Same" and Ser. No. 11/053,135 entitled "EEPROMS using Carbon Nanotubes," both of which are incorporated by reference in their entireties and are commonly assigned to the assignee of the present invention. There is a gap region 64' above and below the metallic SWNTs as illustrated in prior art FIG. 7B.

FIGS. 9A-9B illustrate burn-off of the metallic SWNTs. First, the semiconducting SWNTs are turned off using the bottom (back) gate silicon substrate. These SWNTs are p-type because exposure of SWNTs to oxygen results in the adsorption of oxygen atoms on the surface of the nanotubes. The prior art concepts of using a back gate to turn OFF the semiconductor channel region (explained above with respect to FIGS. 1 and 2) is applied to the NT-channel region 80 turning SWNTs OFF, such that only the metallic SWNTs conduct, forming a porous patterned conductor layer.

FIG. 9A, top curve, illustrates the conduction of the channel region as the voltage $V_{GATE}$ is swept from −10 to +10 volts with a drain to source voltage of 2 volts. The voltage range is relatively high because the oxide and gap thicknesses are relatively high. The voltages can be scaled to smaller values by scaling gap and oxide values. In the presence of both metallic and semiconducting SWNTs in parallel, the $I_{ON}/I_{OFF}$ current ratio is very small, approximately 1.5 times, for example. A back bias voltage is applied turning OFF the semiconducting SWNTs, and current is forced through the metallic SWNTs in the channel region. FIG. 9B illustrates current flow to nearly 35 uA, at which point nanotubes fail (become open-circuited) and are eliminated from the conductive path. The source-drain voltage $V_{SD}$ increases to approximately 8 volts before metallic SWNTs are open, with a maximum total current is approximately 35 uA. The maximum burn-off current per metallic SWNT is estimated as 10 to 20 uA. FIG. 9A, bottom curve, of $I_{SD}$ vs. $V_{GATE}$ illustrates P-CNFET behavior with an $I_{ON}/I_{OFF}$ ratio $>10^5$ times, confirming that only semiconducting SWNTs remain in the channel region. In other words, a non-woven SWNT nanofabric layer may be deposited (spun-on, for example), patterned, a CNFET device region defined, and metallic SWNTs burned-off, resulting in a P-CNFET device with channel formed by one or more semiconducting SWNTs.

Nanofabric Semiconductor SWNT P-CNFETs, Ambipolar CNFETs, and N-CNFETs

Once metallic SWNT burn-off is complete, P-CNFET devices remain. These devices may be left as P-CNFETs, or may be converted by chemical processes to Ambipolar CNFETs and/or N-CNFETs.

In addition to the post metallic SWNT burn-off P-CNFET I-V characteristic illustrated in FIG. 9A, P-CNFET I-V characteristics are also illustrated in FIGS. 10A and 10B. In FIG. 10A, the FET I-V characteristic is in the normally OFF state (with gate to source voltage of zero) and threshold voltage of approximately −2.5 volts. In this case, the as-fabricated P-CNFETs result in the desired normally OFF state. For other fabricated devices, the resulting P-CNFET I-V characteristics are as illustrated in FIG. 10B. The P-CNFET device illustrated in FIG. 10B is in the normally ON state, with threshold voltage of approximately +2.5 volts (with gate to source voltage of zero). For such devices, a combination of as-fabricated and electrostatic coupling to the semiconducting SWNT region is required for the P-CNFETs to be in the normally OFF state, as described with respect to prior art FIGS. 1 and 2. For such devices, a gate such as the back gate 86 illustrated in FIG. 8 is used to turn-OFF the P-CNFET devices, and another gate, such as the top gate 74, is used to activate the device as part of an electrical circuit.

FIG. 11 illustrates the conversion of a P-CNFET shown in FIG. 8 to an Ambipolar-CNFET using the desorption of oxygen. The Ambipolar-CNFET in a two gate structure can be used in circuit applications as described further below. Research efforts with individual SWNT fibers have shown conversion from P-CNFET to N-CNFET after polyethyleneimine (PEI) doping (not shown) See, Zhou, Y., et al., "p-Channel, n-Channel Thin Film Transistors and p-n Diodes Based on Single Wall Carbon Nanotube Networks" Nano Lett. 2004, Vol. 4 No. 10, 2031-2035 and Shim, M., et al, "Polymer Functionalization for Air-Stable n-Type Carbon Nanotube Field-Effect Transistors," J. Am. Chem. Soc. 2001, 123, 11512-11513 Various I-V characteristics described above used bottom (back) gate modulation. FIG. 12 illustrates that the top gate can also be used to control the I-V characteristic in the channel region. The top gate voltages are relatively large because of the large spacing and air "dielectric," however, scaling of geometries will significantly reduce voltage levels to the 1 to 3 volts range of operation.

Metallic SWNT Burn-off Structures and Architecture for Use with Passive Substrates Metallic SWNT burn-off structures, burn-off conditions, and resulting CNFET characteristics have been illustrated above with respect to FIGS. 8-12. In order to design memory and logic products using these results, it is necessary to integrate a large number of CNFET devices with a process that includes a burn-off of metallic SWNTs in CNFET devices, a dual gate structure to ensure optimized device operation, and interconnections to accommodate both burn-off and final product wiring. Because a passive substrate has been chosen, burn-off and burn-off verification tests must be carried out by a tester without assistance from on-chip devices, such as would available if an active substrate were used.

FIG. 13A illustrates a pre-NT nanofabric integrated structure 90, including a pre-NT nanofabric integrated structure surface 91, and an insulator (passive) substrate 92 containing a bottom (back) gate 86, an insulator 84, and a second insulator 82. Insulator 84 may be SiN, for example, of thickness 1 to 10 nm, for example. Insulator 82 may be $SiO_2$, $Al_2O_3$, or another insulating material, for example, of thickness 1 to 10 nm, for example. A gap will be etched in insulator 82 (illustrated further below), through the porous NT layer, to introduce thermal resistance for metallic SWNT burn-off as discussed above. Insulator 84 will act as an etch stop when forming the gap region in insulator 82.

Figure 13B:
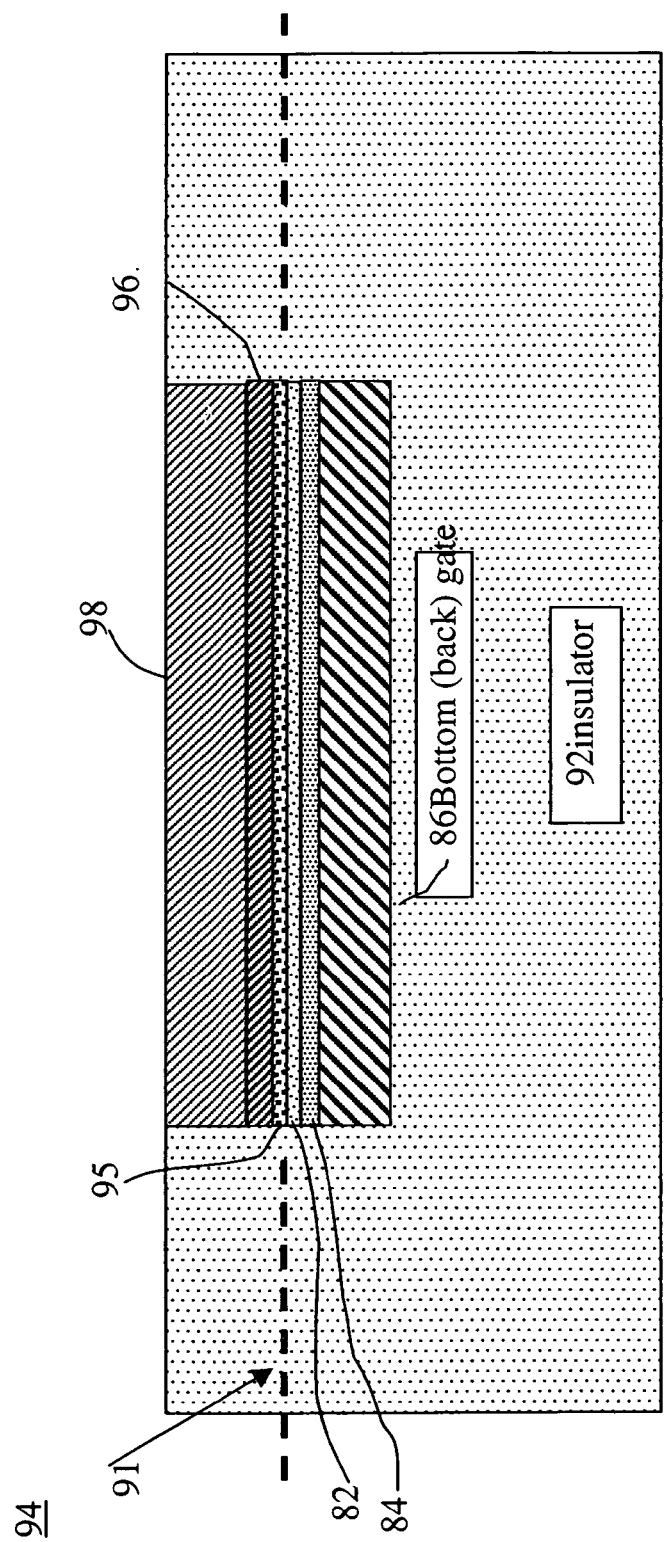

FIG. 13B illustrates a partially completed CNFET structure 94 after deposition of a carbon nanotube layer 95 similar to the layer illustrated in FIG. 4, with a nanotube conductive contact layer 96 and a conductor wiring layer 98. The contact layer, wiring layer, and nanotube fabric are patterned.

Figure 13C:
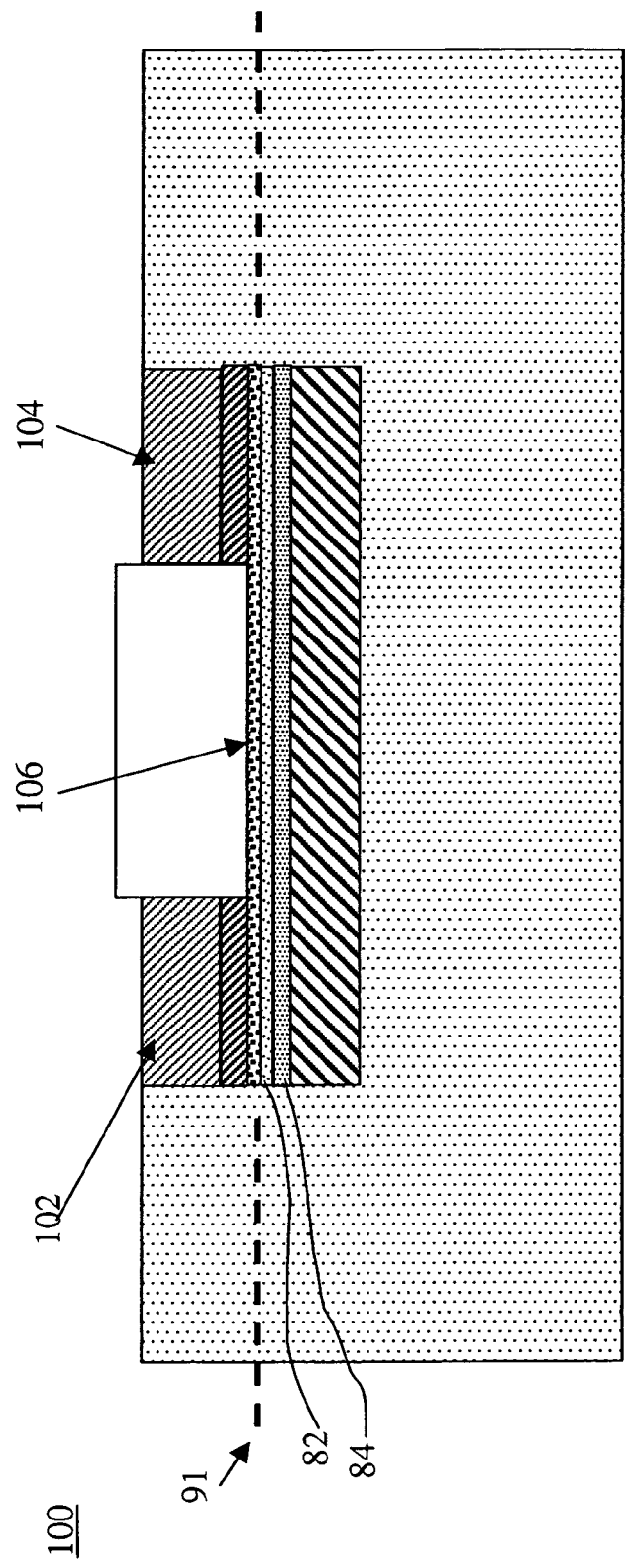

FIG. 13C illustrates a partially completed CNFET structure 100 after etching the wiring layer 98 and contact layers 96 shown in FIG. 13B to create source and drain contact regions 102, 104 and expose the SWNT channel region 106 between source and drain.

Figure 13D:
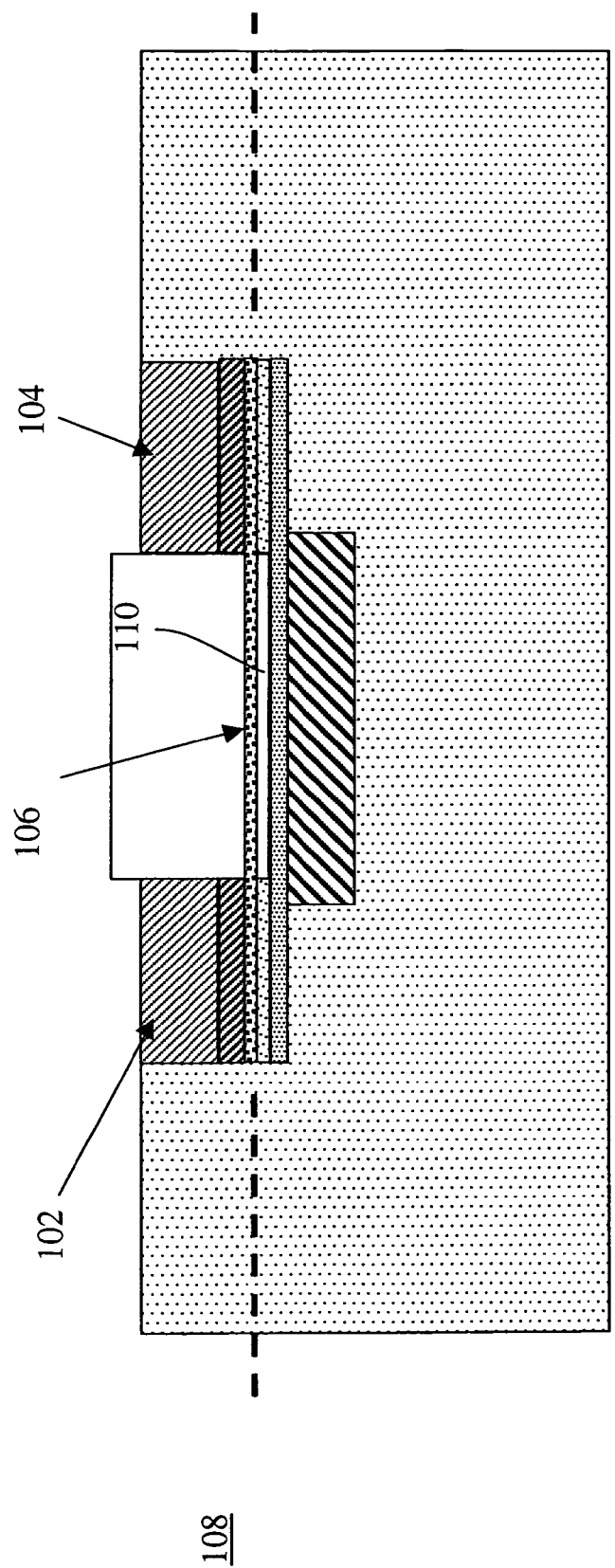

FIG. 13D illustrates a partially completed CNFET structure 108 ready for burn-off, with a gap region 110 under the SWNT channel region 106.

Figure 14A:
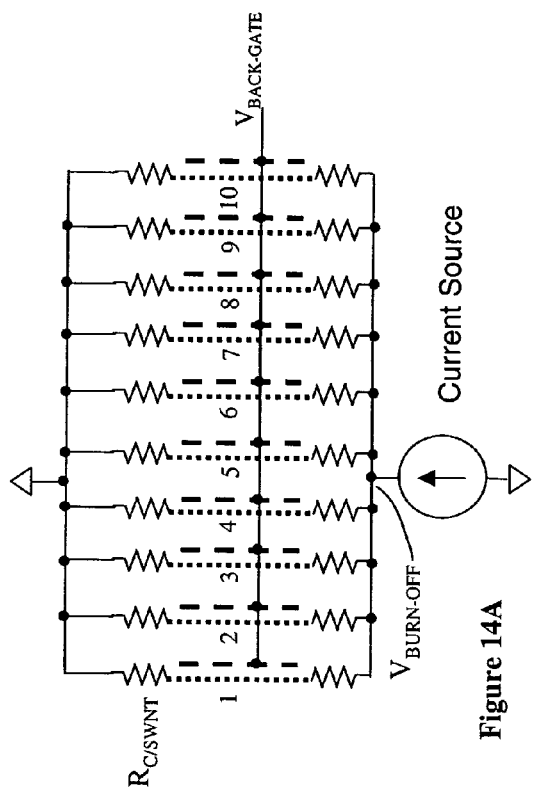
FIGS. 14A-14B are schematic representations of devices according to aspects of the invention.

FIG. 14A is a schematic representation of 10 parallel metallic SWNTs in a CNFET device (the parallel semiconducting SWNTs are not shown). Each SWNT has a source contact resistance between conductor and nanotube of $R_{C/SWNT}$, and each drain also has a contact resistance of $R_{C/SWNT}$. $R_{C/SWNT}$ resistance values range from 10,000 to 100,000 ohms at each nanotube depending contact metals used and processing techniques used. The nanofabric (FIG. 4, for example) has approximately 2 semiconducting nanotubes for every 1 metallic nanotube. For a CNFET containing 20 semiconducting nanotube, 10 metallic nanotubes need to be burned-off. For the 10 metallic SWNTs illustrated schematically in FIG. 14A, 10-20 uA of burn-off current is required. Assuming 20 uA of burn-off current per metallic SWNT, a total of 200 uA is required to burn-off the ten metallic SWNTs shown in FIG. 14A.

Figure 14B:
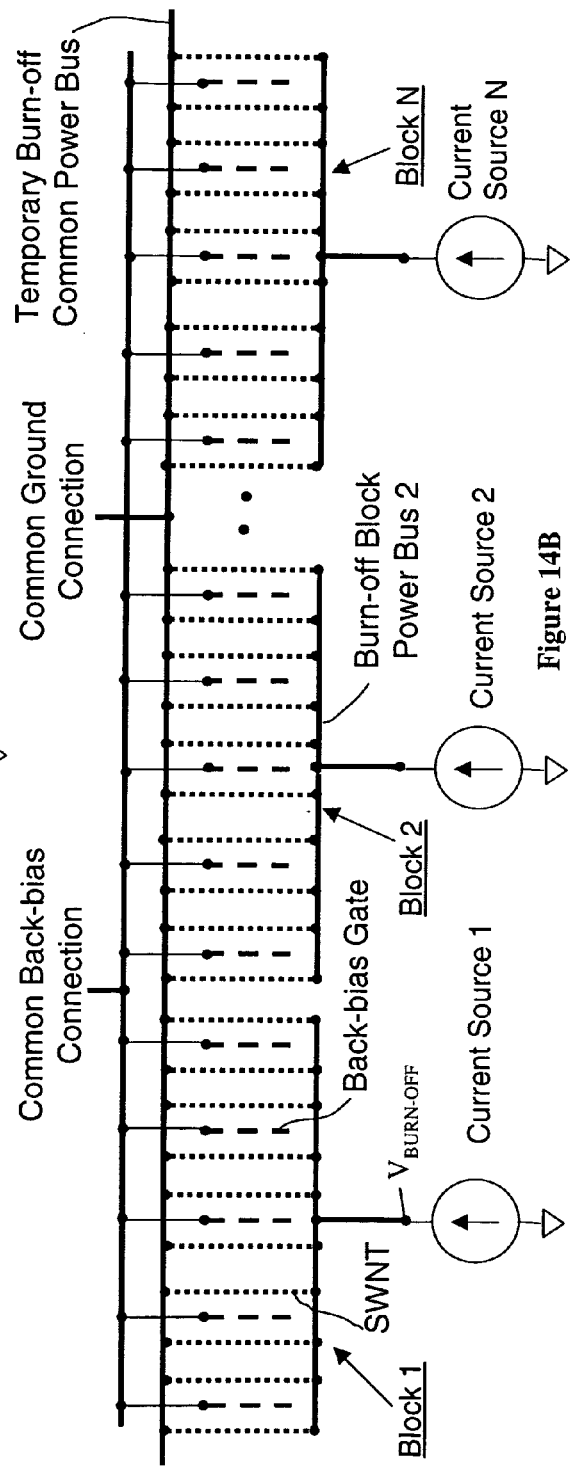

For a chip having 1 million CNFET devices, the devices may be organized in blocks (groups); 1000 blocks each with 1000 CNFET devices, for example, as illustrated in FIG. 14B. If each CNFET has 10 metallic SWNTs to burn off as illustrated in FIG. 14A, then each CNFET requires approximately 200 uA burn-off current per CNFET. For 1000 CNFETs organized in parallel for the purpose of burn-off, a total of 200 mA is required for a 1000 CNFET block.

The burn-off current needs to be supplied by a tester probe to a pad common to the sources of 1000 CNFET devices, with a back gate bias used to turn-off the semiconducting SWNTs. A current of at least 250 mA can be supplied to a pad at wafer level, as described by G. Das et al., "Wafer-Level Test," Chapter 3, of reference book "Area Array Interconnection Handbook," editors K. Puttlitz and P. Totta, Kluwer Academic Publishers, 2001. Since each block of 1000 CNFET devices requires approximately 200 uA of burn-off current, one pad per block connected to parallel source is required to supply the burn-off current and one pad per block connected to parallel drains is required to sink the burn-off current. One pad is required to supply the bottom (back) gate voltage to turn off the semiconducting SWNTs. If each chip has 1000 blocks or 1000 CNFET device per block, the total number of pads required per chip during burn-off is 2001. The burn-off tester supplies all currents, monitors all voltages, measures post burn-off current, and any other operations required during the burn-off cycle. The burn-off cycle is assumed to include moving a wafer into position, lowering the test probe head with 2001 probes, executing burn-off and verifying burn-off, and lifting the probe head from contact with the chip on the wafer. For a burn-off cycle time of approximately 10 seconds per chip and 200 chips per wafer, approximately 2000 seconds or approximately 33 minutes per wafer is required. Sufficient burn-off testers are required to ensure wafer through-put is maintained.

Metallic SWNT Burn-off Structures and Architecture for Use with Active Substrates The use of passive substrates results in long burn-off cycle times by dedicated burn-off testers which can be time consuming and costly. An alternative is to use an active substrate. The active substrate contains CMOS devices used to select CNFET blocks using high voltage tolerant devices (10 to 12 volts maximum, for example) and use well known built-in-self-test (BIST) engines to perform on-chip test and evaluation with a low number of contact pads per chip and simple burn-off testers. There is an increase in the substrate cost per wafer; however, there is a reduction in burn-off time per wafer and burn-off cost. For example, with a 10 pad requirement per chip, and a wafer-level probe with 2000 probes for a 200 chip wafer, burn-off time per wafer may be reduced from 33 minutes to 10 seconds per wafer.

FIG. 15A illustrates a pre-NT nanofabric integrated structure 112 and an active substrate 113 with high-voltage and high-current NFET (HV/HI NFET) devices below a structure containing a bottom (back) gate 86, an insulator 84, and an insulator 82. Insulator 84 may be SiN, for example, of thickness 1 to 10 nm, for example. Insulator 82 may be $SiO_2$, $Al_2O_3$, or another insulating material, for example, of thickness 1 to 10 nm, for example. A gap will be etched in insulator 82 (illustrated further below), through the porous NT layer, to introduce thermal resistance for metallic SWNT burn-off as discussed above. Insulator 84 will act as an etch stop when forming the gap region in insulator 82. The high-voltage diffusion node 114 is designed to tolerate the relatively high voltage of 10 to 12 volts that can occur during metallic SWNT burn-off by using a deeper and more rounded doping profile, as is used to meet the high-voltage requirements of EEPROM devices described in the reference book K. Itoh, "VLSI Memory Chip Design," Springer Publisher, pp. 37-46, 2001. A Poly gate 116 is positioned beneath the bottom (back) gate and in between the common ground 138 and the high-voltage diffusion node.

Figure 15B:
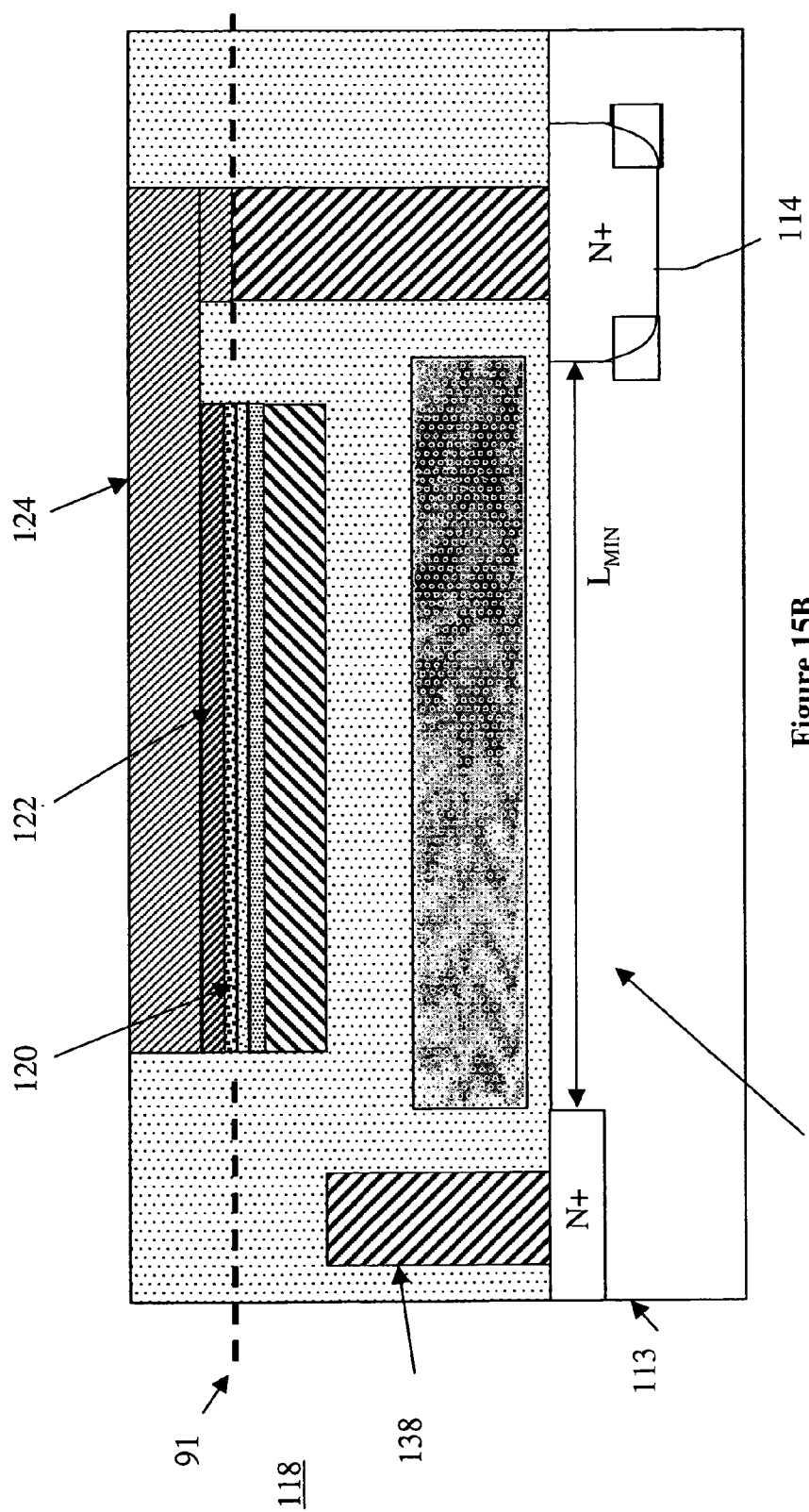

FIG. 15B illustrates a partially completed CNFET structure 118 on an active substrate after deposition of a carbon nanotube layer 120 similar to the layer illustrated in FIG. 4, with a nanotube conductive contact layer 122 and a conductor wiring layer 124. The contact layer, wiring layer, and nanotube fabric are patterned. A high-voltage tolerant diffusion node of a HV/HI FET 114 is connected to one of the nanotube contacts and a common ground 138 is left unconnected to the other nanotube contact.

Figure 15C:
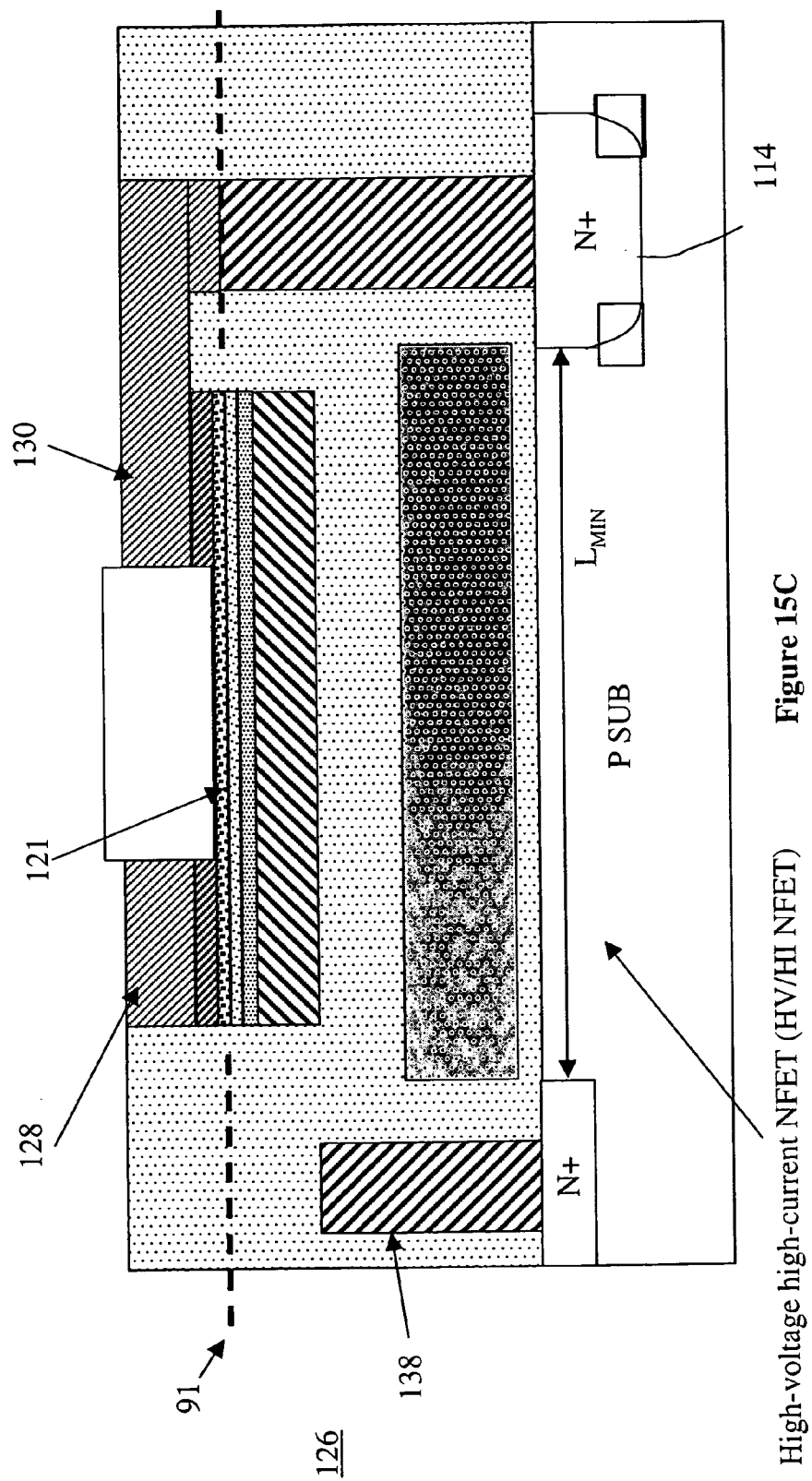

FIG. 15C illustrates a partially completed CNFET structure 126 on an active substrate after etching the wiring layer 124 and contact layers 122 shown in FIG. 15B to create source and drain contact regions 128, 130 and expose the SWNT channel region 121 between source and drain.

Figure 15D:
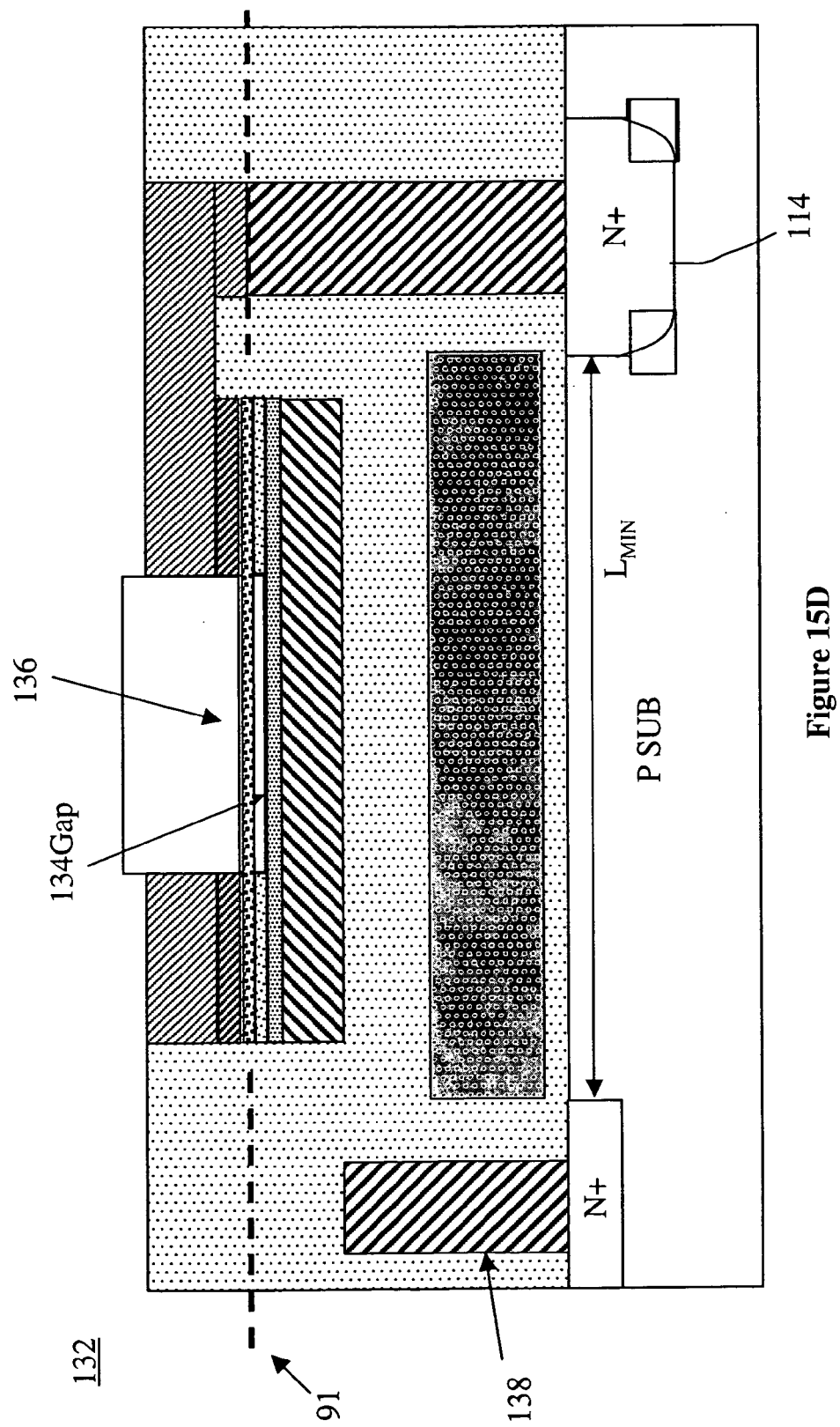

FIG. 15D illustrates a partially completed CNFET structure 132 on an active substrate ready for burn-off, with a gap region 134 under the SWNT channel region 136.

Figure 15E:
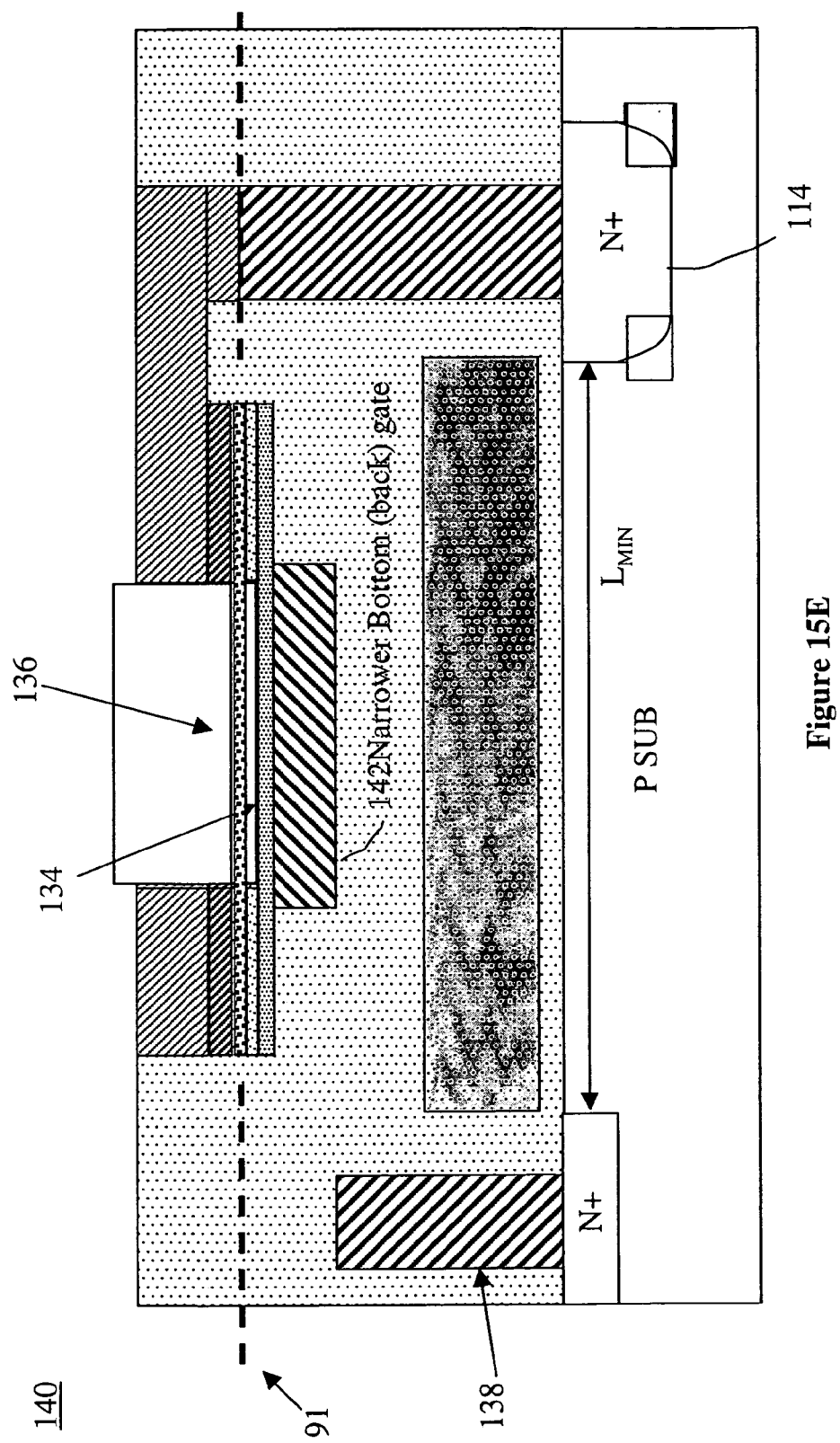

FIG. 15E illustrates a partially completed CNFET structure 140 on an active substrate ready for burn-off, with a gap region 134 under the SWNT channel region 136 as in FIG. 15D. The bottom (back) gate 142 in FIG. 15E is made narrower in order to reduce capacitive coupling to source and drain regions.

Figure 16:
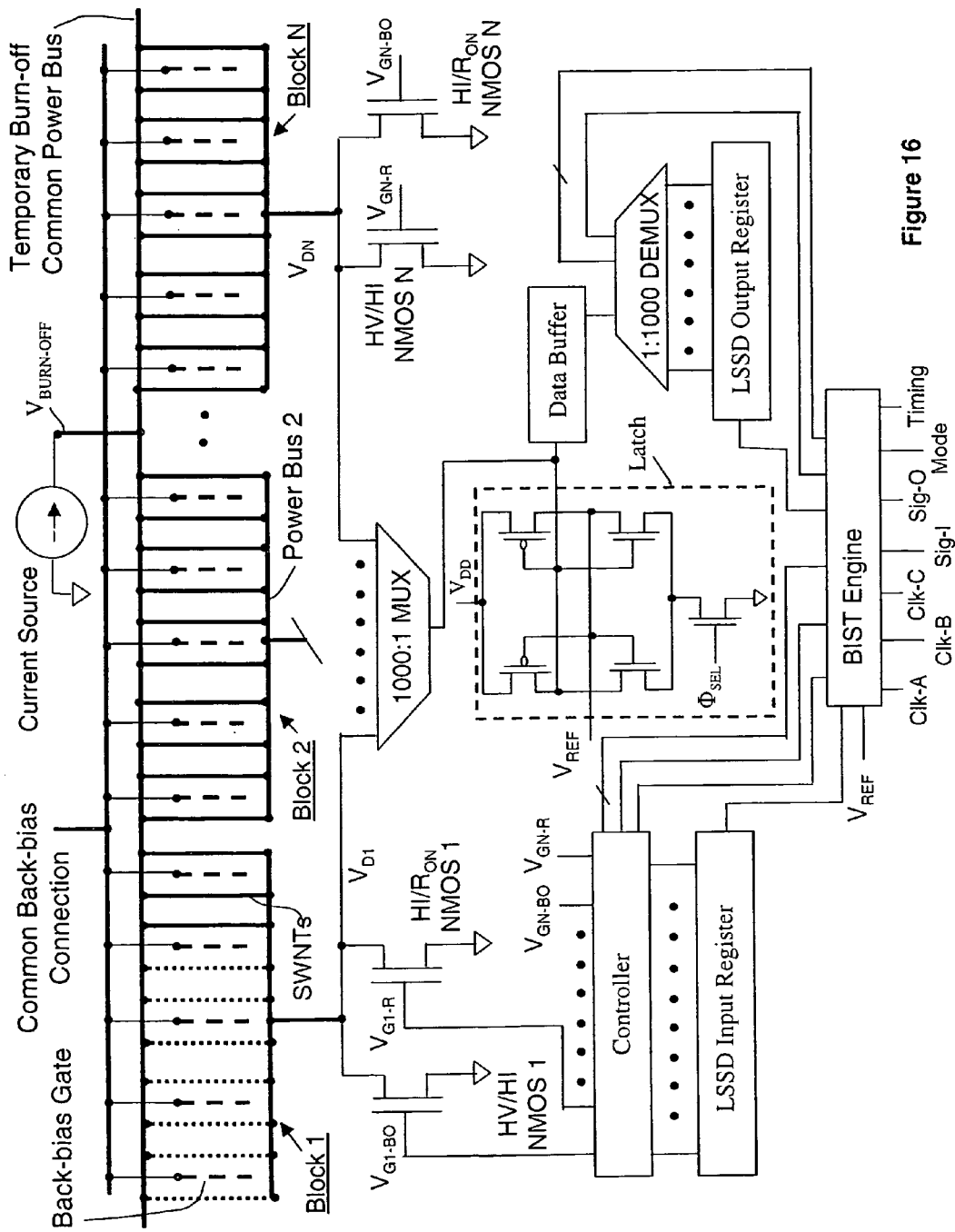
FIG. 16 illustrates a schematic representation of a device according to one aspect of the invention.

FIG. 16 is a schematic representation of 1000 CNFET devices in parallel per block, with 1000 blocks per chip for a total of 1 million CNFET devices. Each CNTFET may have up to 10 metallic SWNTs in parallel, drawing up to 200 uA of burn-off current per CNFET device, or a total of 200 mA of current for a 1000 CNFET block. CNFET sources are connected in parallel. In addition, the source terminals of all 1000 parallel blocks are interconnected by a temporary burn-off common power bus connected to one chip burn-off current (voltage) pad. Each block of 1000 parallel CNFET devices is connected to a HV/HI NMOS burn-off transistor that supplies the up to 200 mA per block. Using an NFET figure-of-merit of approximately 900 uA/um of device width, the HV/HI NMOS transistor is approximately 200 um in width to handle burn-off current of approximately 200 mA for 1000 parallel CNT devices. There is also a parallel HI/$R_{ON}$ NMOS device for evaluating the burn-off state of each block of 1000 CNFET devices in parallel. The HI/$R_{ON}$ device is designed for a resistance value such that incompletely burned-off metallic SWNTs will result in a smaller voltage at node VD, into the 1000:1 MUX, and into the latch. A $R_{ON}$ value for the HI/$R_{ON}$ device may be 100,000 ohms, for example.

The active substrate is designed to include a burn-in-self-test (BIST) Engine for each chip. Use of BIST engine for wafer-level test and burn-in has been described in U.S. Pat. No. 6,426,904 where C. Bertin is a co-inventor. The BIST engine controls level sensitive scan design (LSSD) protocol. The LSSD latch protocol allows a single input pin Sig-I to provide a data stream of input test vectors to activate selected blocks. The LSSD latch protocol also allows a single output pin Sig-O to scan out the compare results stored in an output register and stream test results data out to a burn-off tester that determine which blocks have CNFETs with metallic SWNTs that have not been burned OFF. Clocks A, B, and C are specified by the well known LSSD latch protocol and will not be described here. Mode and timing signals are also provided by an external tester. BIST engine outputs generate control signals that control burn-off, burn-off evaluation tests, scan new data in and data out. There are a total of 10 pads per chip to perform the metallic SWNT burn-off and evaluation testing. One burn-off pad, one ground pad, one common bottom (back) gate pad, one timing pad, one mode pad, and five BIST LSSD protocol pads (Clk-A, B, C, and Sig-I and Sig-O) are provided for a total of ten pads per chip. For 200 chips per wafer, a full wafer 2000 terminal probe can be used for burn-off of an entire wafer. Each block of 1000 CNFET devices is burned-off sequentially such that a current of 250 mA is not exceeded. Full-wafer probing techniques are discussed by C. Bertin et al., "Known Good Die (KGD)," Chapter 4, of reference book "Area Array Interconnection Handbook," editors K. Puttlitz and P. Totta, Kluwer Academic Publishers, 2001. Two hundred chips are simultaneously tested in parallel for a 10 second test time per wafer.

The choice of a passive substrate or an active substrate is based on cost and technical feasibility. The higher cost of an active substrate is offset by the simpler wafer level tester and higher wafer-level burn-off throughput of 10 seconds vs. 33 minutes.

Finalizing CNFET Device Structures after Burn-off

Figure 17A:
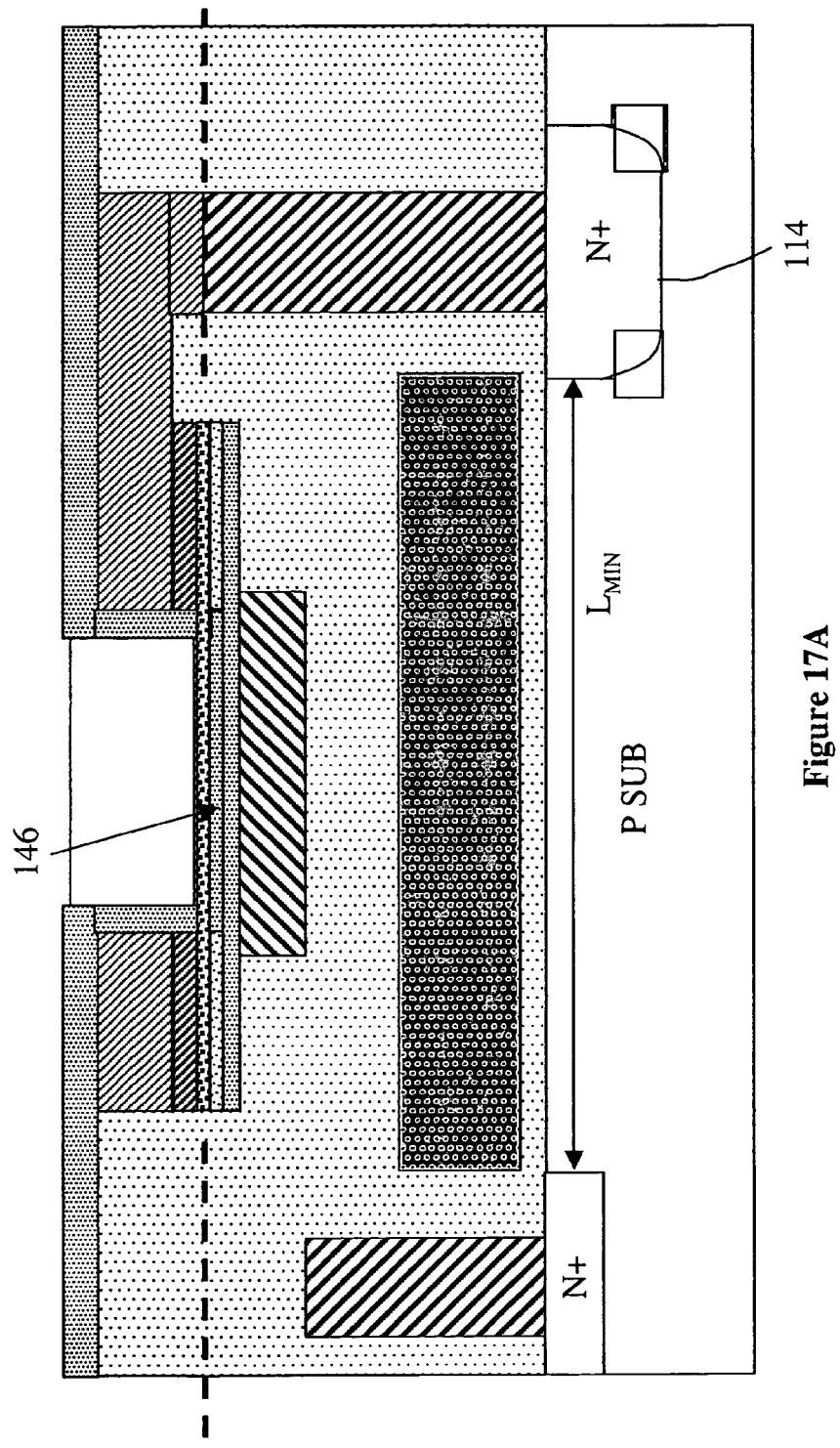
FIGS. 17A-17E illustrate intermediate structures according to aspects of the invention.
Figure 17B:
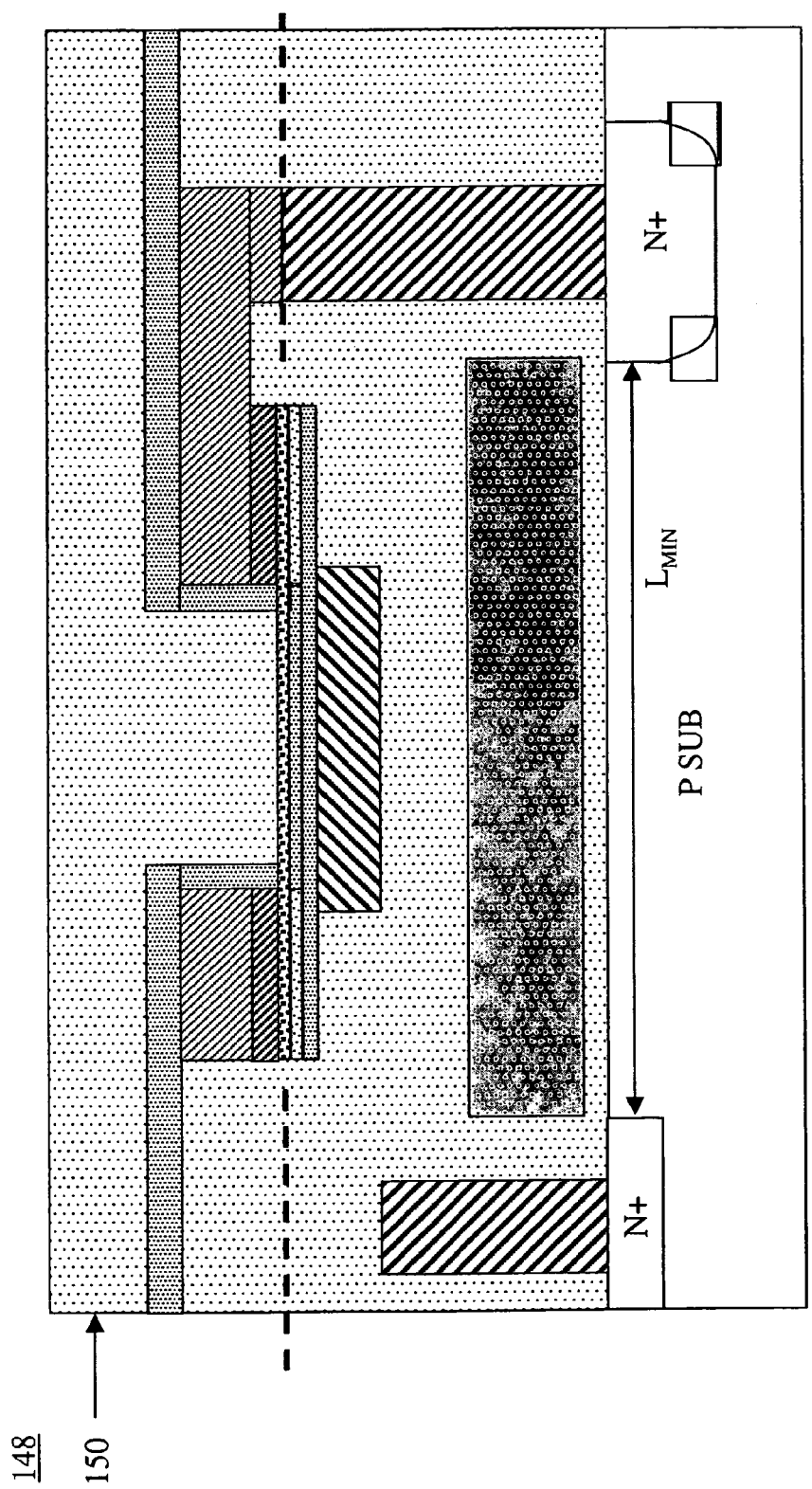

After completion of burn-off of the CNFET device illustrated in FIG. 15E, only semiconductor SWNTs 136 remain in the channel region, and the gap region 134 is filled with an insulator 146 through the porous (90% porous, for example) nanotube layer 136 as illustrated in the structure 144 shown in FIG. 17A. The gap layer may be in the range of 1 nm to 20 nm. For shallow gap heights in the 1-3 nm range, for example, atomic layer deposition (ALD) may be used. For medium gap heights in the 3 to 20 nm range, for example, chemical vapor deposition (CVD) techniques may be used. For large gaps, in excess 20 nm, for example, sputtering or spin-on-glass techniques may be used. The inventors foresee that a variety of technologies compatible with standard semiconducting processing for use in either low or high K dielectric materials may be of use for this application including but not limited to $SiO_2$, $Si_3N_4$, or silicon oxynitrides of various forms. The interface region between semiconductor SWNTs and insulators is not a critical factor in device operation as is the case for the $Si/SiO_2$ interface used for conventional FETs. At this point, all CNFET devices are P-CNFETs. P-CNFETs may be covered by a protective layer 150 as illustrated in FIG. 17B, and the remaining P-CNFETs may be treated chemically using oxygen desorption as illustrated in FIG. 11 to create Ambipolar-CNFETs. Conversion from P-CNFET to N-CNFET after polyethyleneimine (PEI) doping (not shown) may also be used.

At this point in the process, if the I-V device characteristics of the P-CNFETs and Ambipolar-CNFETs and/or N-CNFETs were as desired by using only chemical treatment, a single bottom (back) gate structure 148 such as illustrated in FIG. 17B would be sufficient for product design usage. For example, the P-CNFET of FIG. 10A is normally OFF with a gate-to-source voltage of zero, and if a threshold voltage of −2.5 volts is desirable, there is no need to use a bottom gate to electrostatically adjust the I-V characteristic of the P-CNFET. Accordingly, the device may be used as-is for product design, with the bottom gate used as a P-CNFET input gate. On the other hand, FIG. 10B is an example of a P-CNFET that is normally ON when gate-to-source voltage is zero, requiring a back gate to electrostatically position the I-V characteristic in the normally OFF state, and a second gate, top gate for example, to operate the device as part of a circuit. Such dual-gate structure for P-CNFETs, Ambipolar-CNFETs, and/ or N-CNFETs, a bottom gate and a top gate, are likely to be required at this stage of technology development.

Figure 17C:
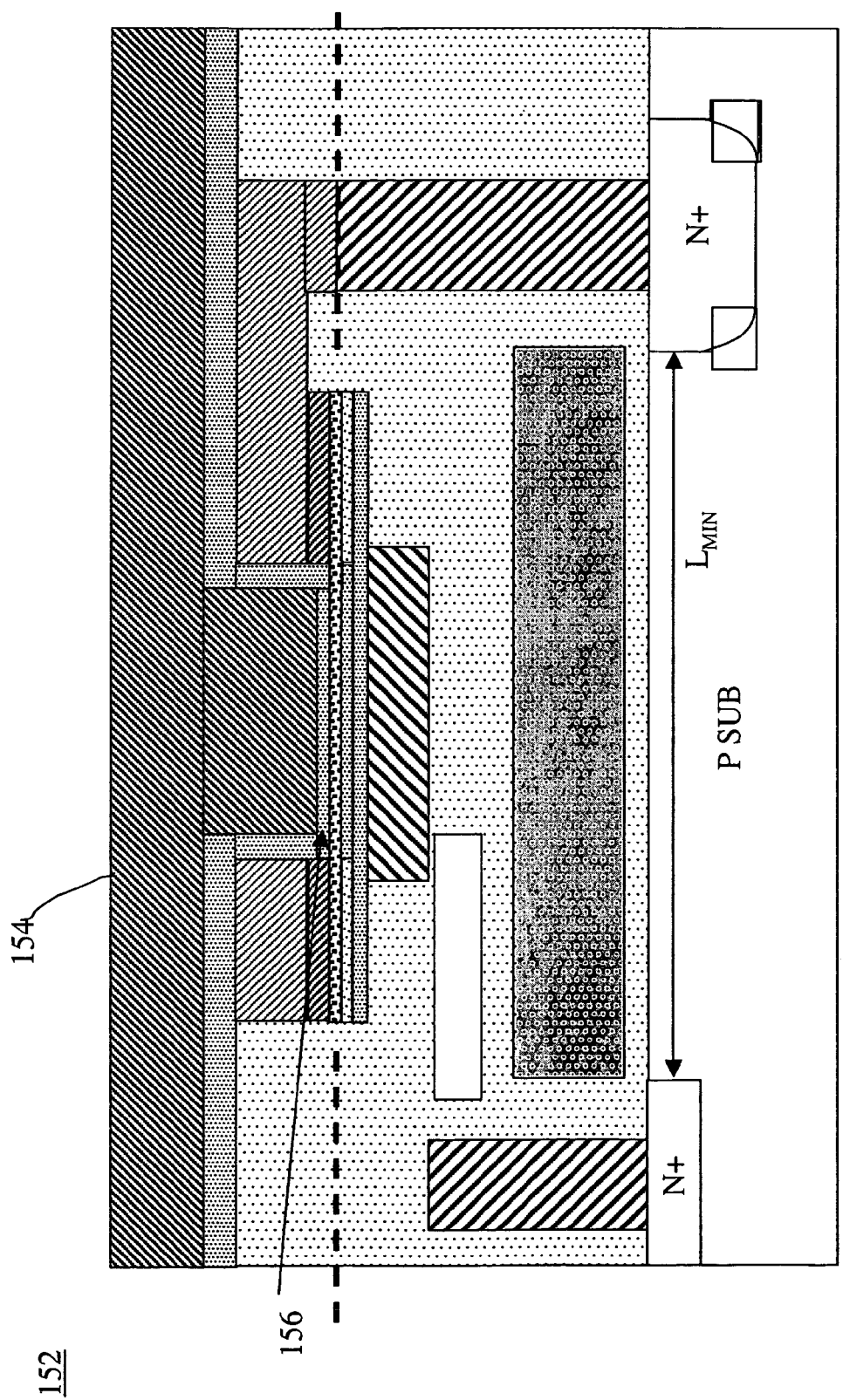
Figure 17D:
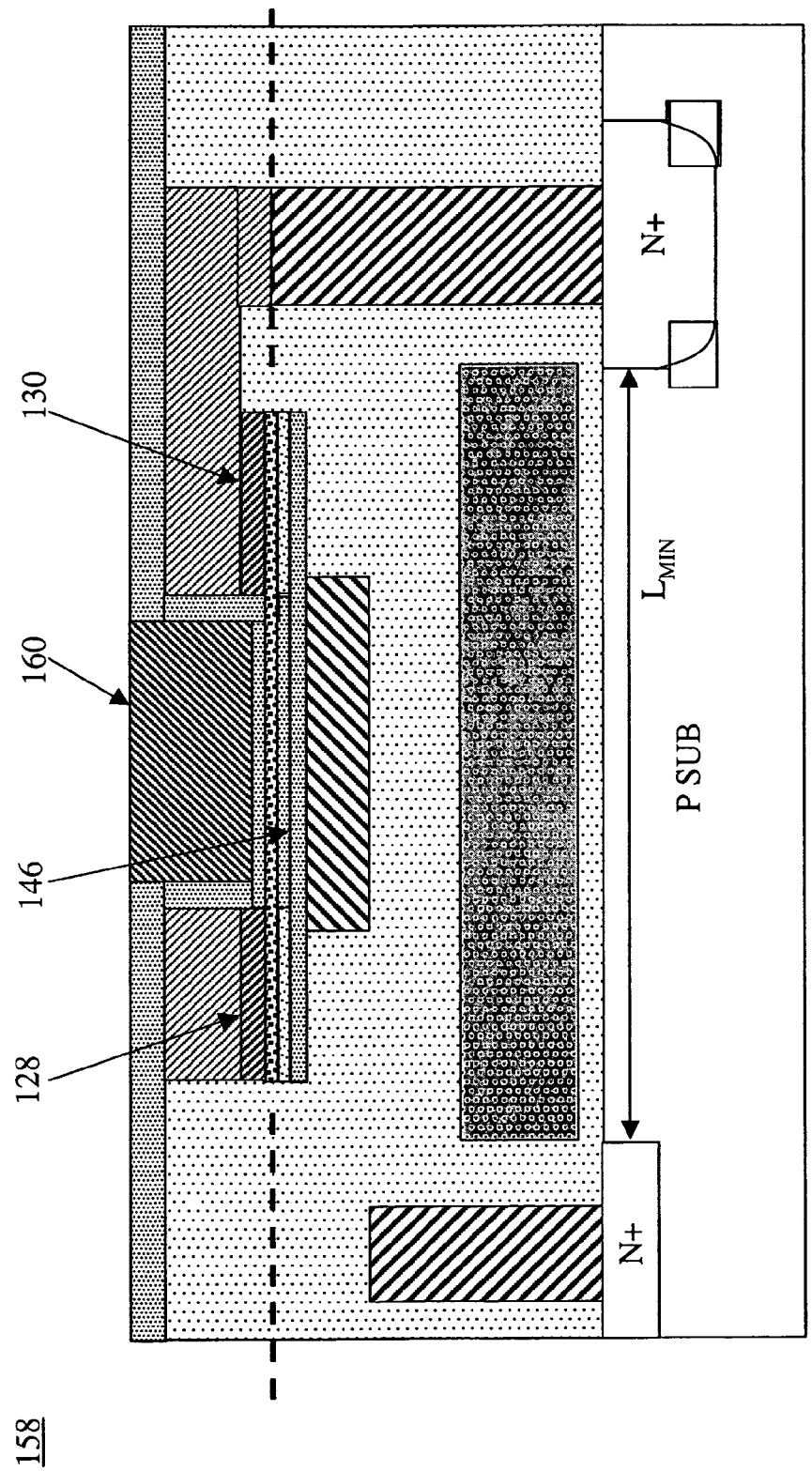
Figure 17E:
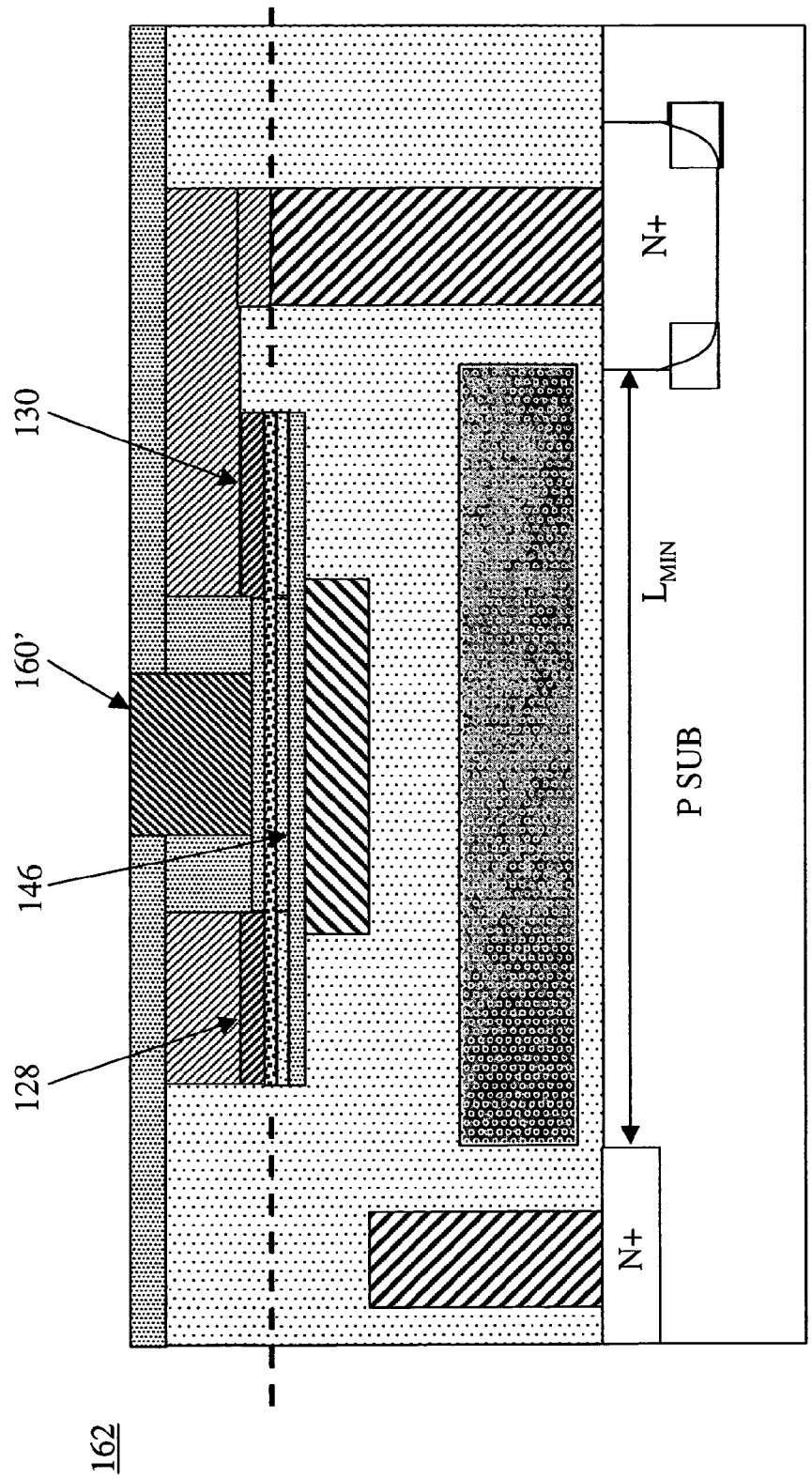

FIG. 17C illustrates a device structure 152 in which an additional dielectric layer 156 has been deposited to form a gate insulator for a top gate 154. This thickness is typically in the 2 to 10 nm range. Next, top gate metal 154 is deposited and patterned. FIG. 17D illustrates the top gate region 160 after a planarization step. FIG. 17E illustrates the structure of FIG. 17D 158 after deposition of an additional conformal insulating layer followed by a directional etch prior to the deposition and planarization of the top gate metal 160'. The separation between the top gate 160' and source and drain electrodes 128, 130 in this structure 162 is increased to reduce coupling capacitance.

Burn-off of Metallic SWNTs after Completion of Dual Gate CNFET Device Structures In this burn-off method, a dual gate FET structure 164 is fabricated with a sacrificial layer below the SWNT channel region. The SWNT channel region is composed of both metallic and semiconducting SWNTs. The SWNTs are only exposed on the underside by a gap region 166, similar to the prior art structure in FIG. 7A. The gap region is created by removal of a sacrificial layer such as silicon in the gap region. Fluid (or vapor) communication paths are formed from the surface to the sacrificial gap material layer, as explained in U.S. patent application Ser. No. 10/864,186 entitled, "Non-volatile Electromechanical Field Effect Devices and Circuits using same and Methods of Forming Same" and Ser. No. 11/053,135 entitled "EEPROMS using Carbon Nanotubes." These paths are used to remove the sacrificial gap material. These paths, open to air or other environments to be introduced during processing, are used during metallic SWNT burn-off. These paths may also be used to introduce chemical dopants to the remaining semiconducting SWNTs to obtain desired CNFET device characteristics as discussed above. The fluid communication paths are then sealed off. Back gate voltage used for electrostatic modulation of the channel region may be higher for structures illustrated in FIG. 18 as compared with those of FIG. 17E, for example, because an air gap 166 replaces a portion of the dielectric layer under the SWNT channel region. The structures illustrated in FIGS. 17E and 18 both use shown an active substrate, however, these CNFET device structures may be fabricated on passive substrates as well.

Figure 18:
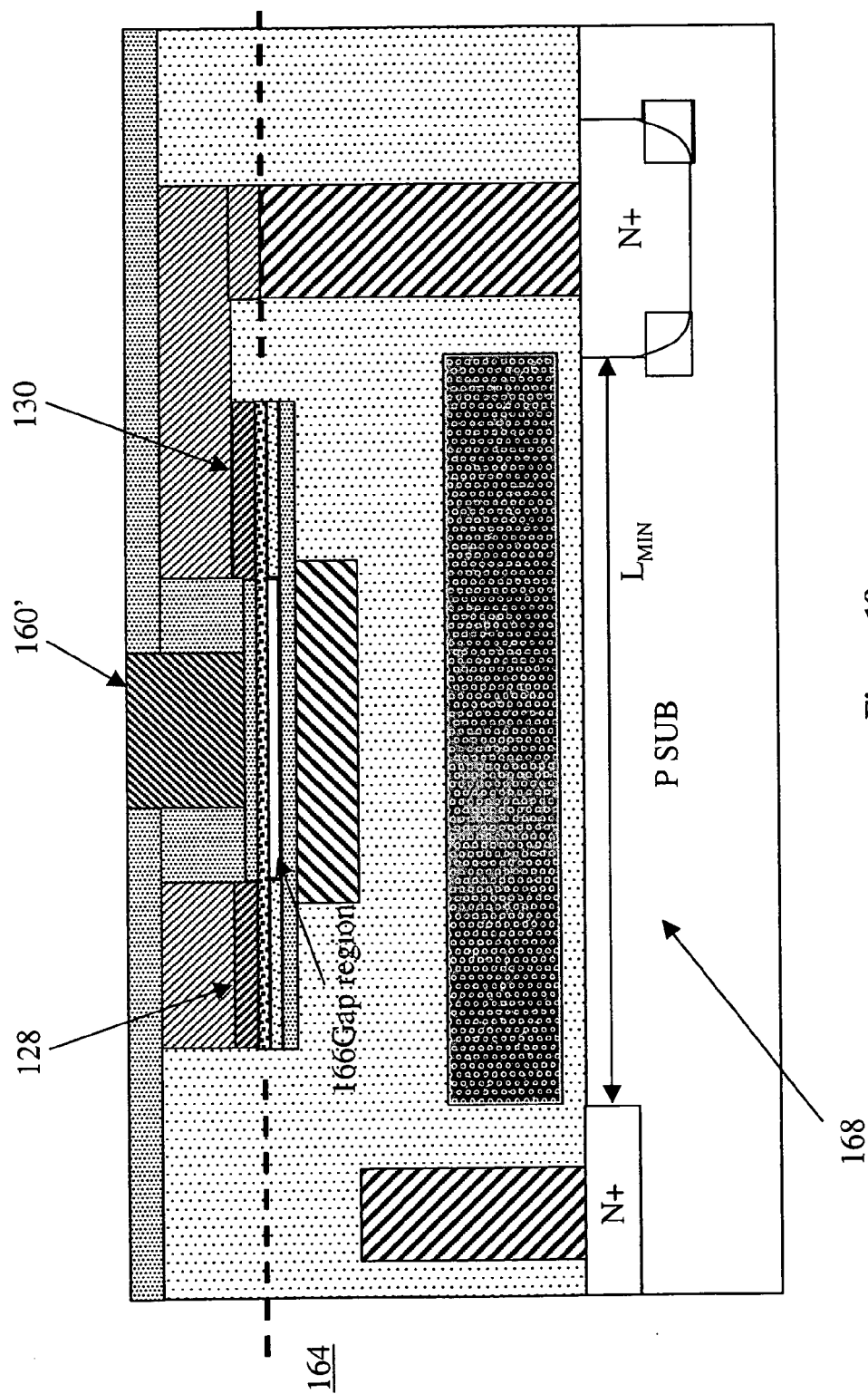
FIG. 18 illustrates a device according to one aspect of the invention.

After completion of the P-CNFET, Ambipolar-CNFET, and/or N-CNFET device structures illustrated in FIG. 17E for devices with burn-off before top gate formation, or FIG. 18 for devices with burn-off after top gate formation, conductive layers associated with burn-off are modified as needed to accommodate product design. Additional layers of insulation, conductors, with vias between layers are used to complete the product chip using industry standard processes.

Figure 19:
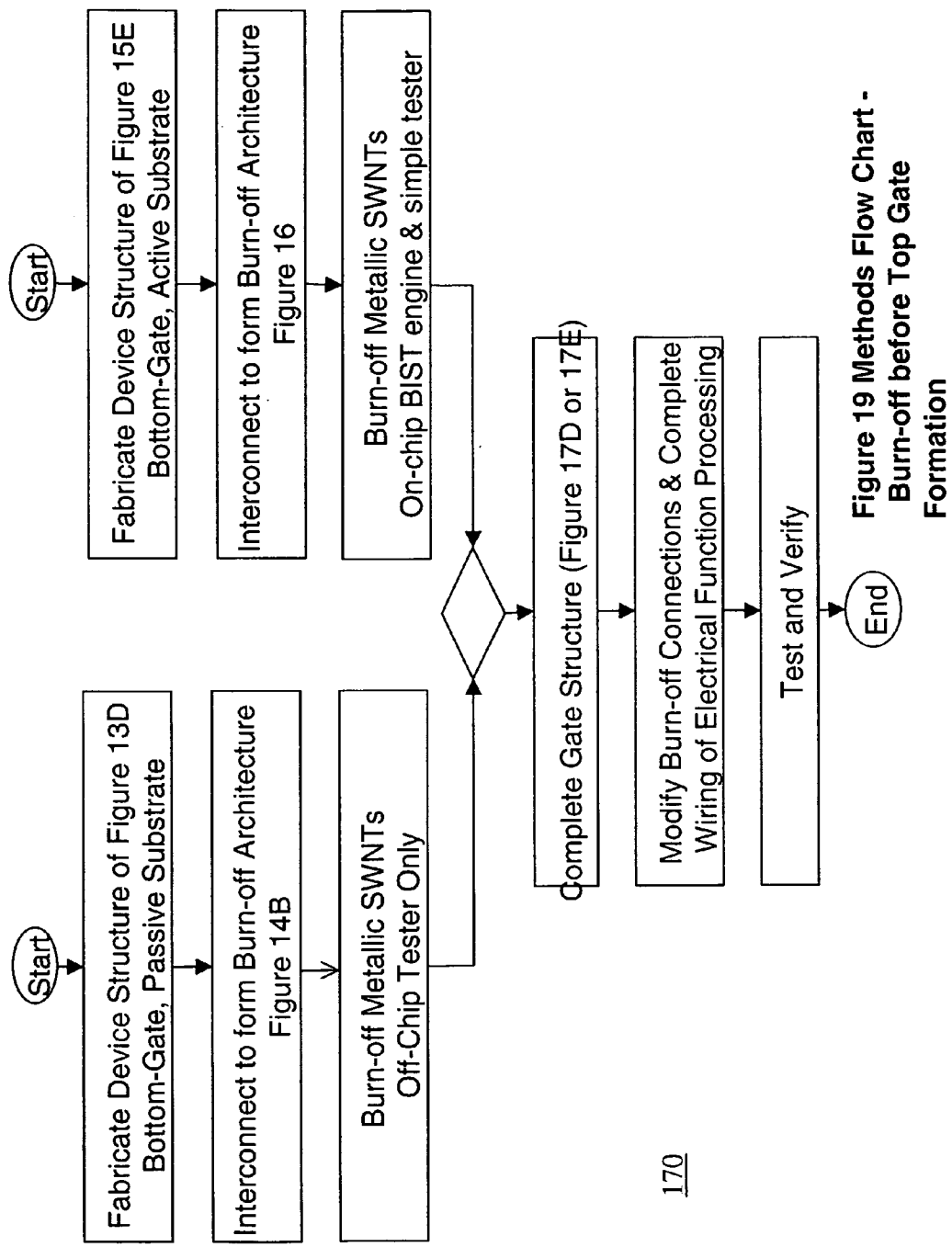
FIG. 19 illustrates a flow chart outlining steps in a method according to one aspect of the invention.

Methods Flow Charts:

Methods flow chart as illustrated in FIG. 19 illustrates major structures and tests required to fabricate CNFET devices using passive or active substrates and metallic SWNT burn-off before top-gate formation. One procedure begins with the fabrication of the device structure illustrated in FIG. 13D using a bottom-gate and passive substrate 170. Next, the device is interconnected to form the burn-off architecture shown in FIG. 14B 171, and the metallic SWNTs are burned off using an off-chip tester 172. A second procedure begins with the fabrication of the device structure illustrated in FIG. 15E using a bottom-gate and passive substrate 173. Next, the device is interconnected to form the burn-off architecture shown in FIG. 16 174. Next, the metallic SWNTs are burned off using an on-chip BIST engine and simple tester 175. Both procedures go on to complete the gate structure as illustrated in FIGS. 17D or 17E 176, modify the burn-off connections and complete the wiring of electrical function processing 177, and test and verify the device 178.

Figure 20:
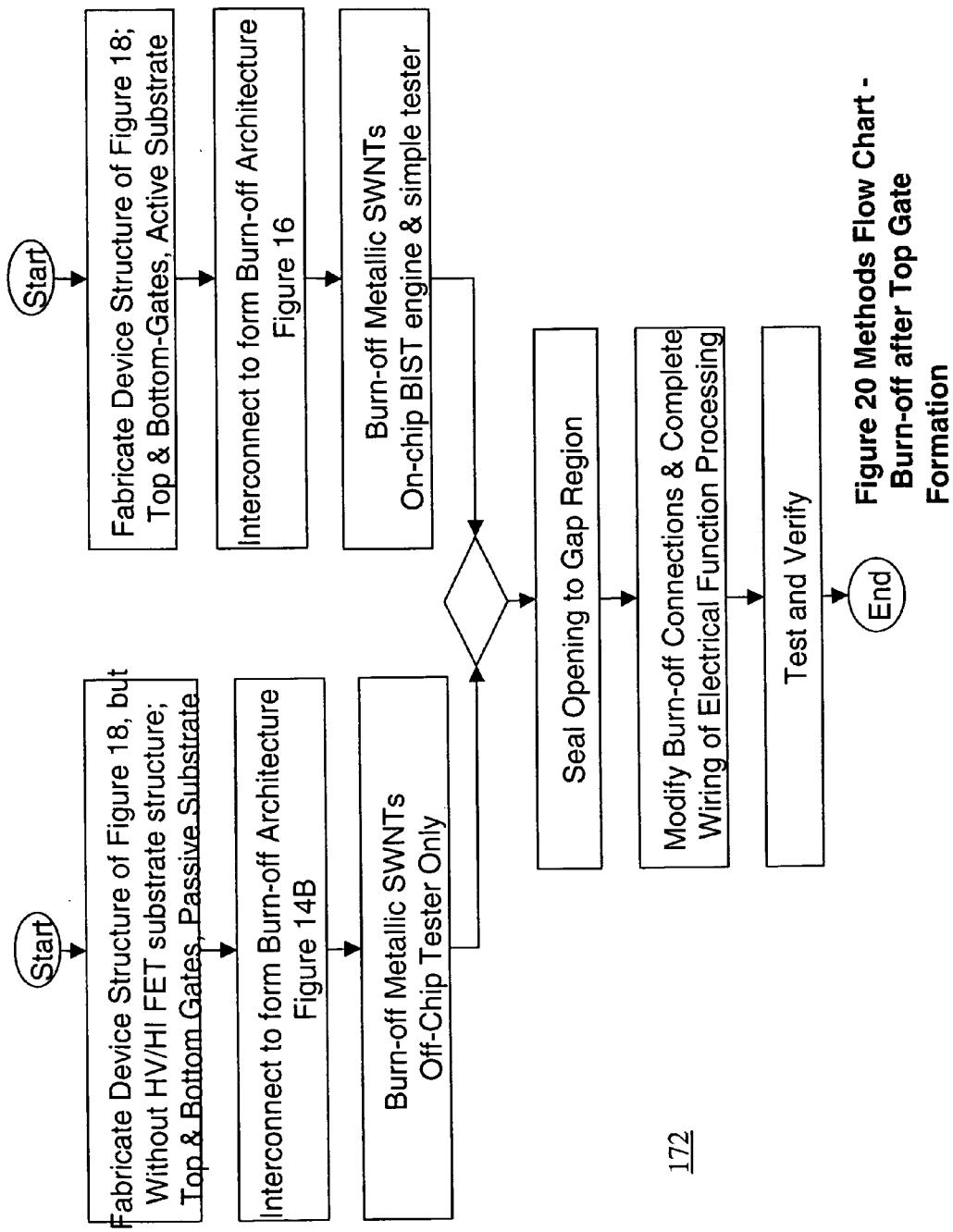
FIG. 20 illustrates a flow chart outlining steps in a method according to one aspect of the invention.

A second methods flow chart as illustrated in FIG. 20 illustrates major structures and tests required to fabricate CNFET devices using passive or active substrates and metallic SWNT burn-off after top-gate formation. A first procedure begins with the fabrication of the device structure of FIG. 18, including the top and bottom gates, as well as a passive substrate, but without the HV/HI FET substrate structure 180. A second procedure begins with the fabrication of the device structure of FIG. 18, containing top and bottom gates, as well as an active substrate 183. Procedures 1 and 2 go on to interconnect the structure to form the burn-off architecture as illustrated in FIGS. 14B and 16, respectively 181, 184. Next, procedure 1 burns off the metallic SWNTs using an off chip tester 182. Procedure 2 burns off the metallic SWNTs using an on-chip BIST engine and simple tester 185. Finally, both procedures seal the opening to the gap region 186, modify the burn-off connections and complete the wiring of electrical function processing 187, and test and verify the device 188.

CNFET Devices Used in Circuit Design

Figure 21:
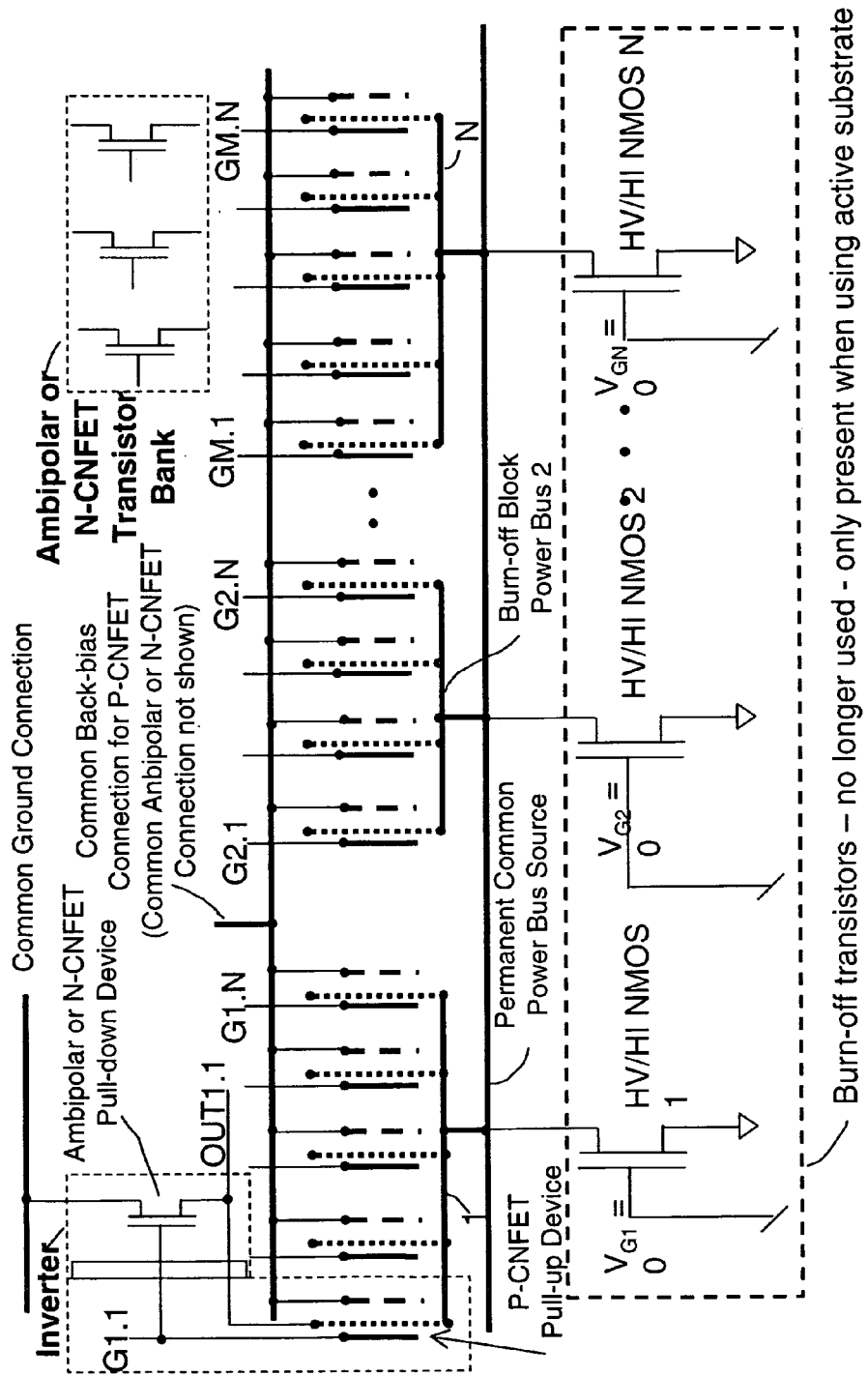
FIG. 21 is a schematic representation of and inverter circuit using P-CNFET pull-up devices and Ambipolar or N-CNFET pull-down devices.

FIG. 21 is a schematic representation of an inverter circuit using P-CNFET pull-up devices and Ambipolar or N-CNFET pull-down devices. Other combinations of devices (not shown) may be used to realize any circuit function. Common interconnect lines used for burn-off as illustrated in FIGS. 14B and 16 have been modified for device interconnections used in product design. FIG. 21 is illustrated with burn-off transistors in an active substrate no longer in use. CMOS transistors in the active substrate (not shown) could be used to build hybrid functions using FETs and CNFETs. For passive substrates, burn-off transistors would not be present.

FIGS. 22A-22C illustrate P-CNFET, N-CNFET, and Ambipolar-CNFET devices 174, 188, 190, respectively, fabricated with a bottom-gate electrostatic bias 186, a source 176, a drain 182, an insulator backfill 184, a substrate 175, and SWNTs 178. Bottom plates for P-CNFETs are connected to a common voltage, bottom plates for N-CNFETs are connected to another common voltage, and bottom plates for the Ambipolar-CNFETs are connected to still another common voltage. The electrical characteristics with electrostatic bottom-gate bias are in the desired operating region. The top-gates of P-CNFETs, N-CNFETs, and Ambipolar-CNFETs 180 are used in circuit/product design. FIG. 23A illustrates an inverter 194 using the devices of FIG. 22 to create an inverter using CNFET devices, with bottom-gate electrode voltage electrostatically coupled to the CNFET device channel region to optimize the I-V characteristic illustrated in FIGS. 23A1 and 23A2. The inverter illustrated in FIG. 23A includes an input 200, an output 202, a p-type NT device 174, and an Ambipolar-type NT device 192. The density of SWNT fibers deposited to make up the nanofabric illustrated in FIG. 4 may be increased. The width of the patterned nanofabric in the CNFET channel region, combined with the SWNT nanofabric density, determine channel current and channel resistance in response to applied voltage. FIG. 24 is a table illustrating typical resistance values and parasitic capacitance targets for applications with requirements ranging from low power to high performance.

FIG. 23 illustrates an inverter using the devices of FIG. 22 to create an inverter using CNFET devices, with bottom-gate electrostatic voltage to optimize the I-V characteristic. The density of SWNT fibers deposited to make up the nanofabric illustrated in FIG. 4 may be increased. The width of the patterned nanofabric in the CNFET channel region, combined with the SWNT nanofabric density, determine channel current and channel resistance in response to applied voltage. Table 1 illustrates typical resistance values and parasitic capacitance targets for applications with requirements ranging from low power to high performance.

The inventors foresee that additional chemical doping of SWNTs using well-known chemical functionalization may become advantageous for achieving higher performance of the aforementioned devices. In the case of n-type doping it may be advantageous to prepare nanotubes doped with reduced or metallic species or atoms both after the nanofabric has been applied as well as in part of a bulk process before application. In the case of the latter a variety of covalent chemical functionalization techniques can be utilized including reduction of SWNTs in the presence of strong reducing agents. Such reducing agents are but not limited to the following including $LiAlH_4$, NaH, KR, $CaH_2$ and additional metallic reductants containing, Zn, Mn or Al.

Additionally, functional materials derived from such species as pyrenes may prove helpful in providing necessary charge transfer states to generate n-type behavior in SWNTs.

The inventors also foresee that additional chemical doping or functionalization of SWNTs to create p-type semiconductors may be advantageous as well. Once again such functionalization can be accomplished before or after the nanofabric is applied to the substrates. Such oxidizing agents include but are not limited to the following including Fluorine gas ($F_2$), ozone ($O_3$), $S_2O_8^{2-}$ anion as various salts, $Co^{3+}$+, $H_2O_2$, $Au^+$, $MnO_4^-$ (as various salts), Chlorine gas ($Cl_2$). Additionally various oxidative steps involving reactive plasmas may be useful. Additionally, functional materials derived from such species as pyrenes may prove helpful in providing necessary charge transfer states to generate p-type behavior in SWNTs.

The inventors also foresee that in certain device types it may be advantageous to convert between p- and n-type SWNT behavior or vice versa. In such instances chemical functionalization, derivitzation or doping using the aforementioned methods may be utilized as well.

Other Embodiments

While the embodiments above were illustrated with suspended fabrics to facilitate burn-off of metallic nanotubes, the inventors envision that burn-off may be achieved with partially suspended fabrics and non-suspended fabrics as well.

While all of the figures in the present application suggest that the nanotube fabric channel is horizontally oriented, other embodiments of the present invention utilize vertical or non-horizontally oriented nanofabric channels along with adjacent gates, arranged in appropriate geometries. Such non-horizontally oriented fabrics may be fabricated according to the methods described in U.S. Pat. No. 6,924,538, entitled, Electro-Mechanical Switches and Memory Cells Using Vertically-Disposed Nanofabric Articles and Methods of Making the Same, which is incorporated by reference in its entirety.

Other embodiments include a double-gated FET having multi-walled carbon nanotubes alone or in combination with SWNTs.

The gates need not be opposed vertically, but may be opposed horizontally. An alternate embodiment of the present invention therefore would include horizontally opposed gates surrounding the channel.

It will be further appreciated that the scope of the present invention is not limited to the above-described embodiments but rather is defined by the appended claims, and that these claims will encompass modifications and improvements to what has been described.

What is claimed:

1. A method of making a nanotube field effect transistor, comprising:
   providing a substrate;
   forming a non-woven fabric of carbon nanotubes on the substrate, wherein at least one of the nanotubes includes a functional material adsorbed on a surface of the nanotubes, the functional material providing charge transfer states on the nanotubes;
   forming a drain region and a source region in spaced relation relative to each other;
   forming a channel region by patterning the non-woven fabric of nanotubes, wherein the nanotubes of the channel region comprise semiconducting nanotubes, and wherein the length of the channel region between the drain region and the source region is less than the average length of the semiconducting nanotubes; and
   forming at least one gate that may be used to modulate the conductivity of the channel region so that a conductive path may be formed between the drain region and the source region, wherein forming the at least one gate comprises:
   depositing a conductive layer in proximity to the channel region; and
   patterning the conductive layer to a length that is similar to the length of the channel region.

2. The method of claim 1, wherein forming the channel region includes removing metallic nanotubes in the nanotubes of the channel region.

3. The method of claim 2, wherein the removing of the metallic nanotubes comprises subjecting the metallic nanotubes to electrical stimulation so as to fail all of the metallic nanotubes.

4. The method of claim 3, further comprising applying an electrical bias to the non-woven fabric so as to turn off the conductivity of the semiconducting nanotubes before subjecting the metallic nanotubes to the electrical stimulation.

5. The method of claim 3, wherein forming the non-woven fabric comprises forming a suspended fabric with a gap on at least one side of the non-woven fabric to facilitate the failing of the metallic nanotubes.

6. The method of claim 3, wherein forming the non-woven fabric comprises forming a partially suspended fabric with a gap on at least one side of the non-woven fabric to facilitate the failing of the metallic nanotubes.

7. The method of claim 3 wherein the substrate is an active substrate including circuitry therein that may be used to electrically stimulate and fail the metallic nanotubes.

8. The method of claim 3 wherein an off-chip tester is used to electrically stimulate and fail the metallic nanotubes.

9. The method of claim 3 wherein a plurality of field effect transistors are made on the substrate and wherein the substrate is divided to iteratively process a subset of the field effect transistors on the substrate to simultaneously electrically stimulate the channel regions of the subset of the field effect transistors to fail the metallic nanotubes therein.

10. The method of claim 1 wherein the field effect transistor is formed to have a front gate and back gate.

11. The method of claim 10, wherein the back gate may be used to bias the transistor to translate a current voltage relationship of the transistor to a desired range.

12. The method of claim 10, wherein the front gate may be used to bias the transistor to translate a current voltage relationship of the transistor to a desired range.

13. The method of claim 1, wherein the forming of the channel region comprises defining the shape of the channel region in the non-woven fabric of nanotubes and removing nanotubes that are outside of the defined shape of the channel region from the non-woven fabric to result in the formation of the channel region.

14. The method of claim 1 wherein the nanotubes of the channel region comprise all P-type semiconducting nanotubes.

15. The method of claim 1, wherein the forming of the channel region further comprises processing the nanotubes in the channel region such that the channel region comprises all ambipolar semiconducting nanotubes.

16. The method of claim 15 wherein the processing of the nanotubes in the channel region comprises a desorption process.

17. The method of claim 1, wherein the forming of the channel region further comprises processing the nanotubes in the channel region such that the channel region comprises all N-type semiconducting nanotubes.

18. The method of claim, wherein the carbon nanotubes comprise one of single-wall carbon nanotubes, multi-wall carbon nanotubes, and a combination thereof.

19. The method of claim 1, wherein the nanotubes of the channel region comprise all semiconducting nanotubes.

20. The method of claim 1, wherein the forming of the non-woven fabric of nanotubes on the substrate comprises applying a nanotube solution to the substrate, and wherein the nanotube solution comprises semiconducting nanotubes and is substantially free from metallic nanotubes.

21. The method of claim 1, wherein the conductive layer is formed from a metallic material.

22. The method of claim 1, wherein the conductive layer is formed from a semiconductive material.

23. The method of claim 1, wherein the patterning of the conductive layer to a length that is similar to the length of the channel region includes patterning the conductive layer to a length shorter than the length of the channel region.

24. The method of claim 1, wherein the patterning of the conductive layer to a length that is similar to the length of the channel region includes patterning the conductive layer to a length longer than the length of the channel region.

25. The method of claim 1, wherein the patterning of the conductive layer to a length that is similar to the length of the channel region includes patterning the conductive layer to a length substantially equal to the length of the channel region.

26. The method of claim 1, wherein the functional material includes one or more of an oxygen atom, a pyrene molecule, and a combination thereof.

27. A method of making a nanotube field effect transistor, comprising:
providing a substrate;
forming a non-woven fabric of nanotubes on the substrate;
forming a drain region and a source region in spaced relation relative to each other;
forming a channel region by patterning the non-woven fabric of nanotubes, wherein the nanotubes of the channel region comprise semiconducting nanotubes, and wherein the length of the channel region between the drain region and the source region is less than the average length of the semiconducting nanotubes; and
forming at least one gate that may be used to modulate the conductivity of the channel region so that a conductive path may be formed between the drain region and the source region, wherein forming the at least one gate comprises:
depositing a conductive layer in proximity to the channel region; and
patterning the conductive layer to a length that is similar to the length of the channel region;
wherein the forming of the channel region includes removing metallic nanotubes in the nanotubes of the channel region, wherein the removing of the metallic nanotubes comprises subiectinq the metallic nanotubes to electrical stimulation so as to fail all of the metallic nanotubes;
wherein the substrate is an active substrate including circuitry therein that may be used to electrically stimulate and fail the metallic nanotubes; and
wherein the circuitry to electrically stimulate and fail the metallic nanotubes operates before completion of the formation the at least one gate.

28. A nanotube field effect transistor comprising:
a drain region and a source region in spaced relation relative to each other;
a channel region connecting the drain region and the source region, wherein the channel region is formed of a patterned non-woven fabric of carbon nanotubes comprising semiconducting nanotubes, wherein the length of the channel region between the drain region and the source region is less than the average length of the semiconducting nanotubes, and wherein at least one of the nanotubes includes a functional material adsorbed on a surface of the nanotubes, the functional material providing charge transfer states on the nanotubes; and
at least one gate formed from a patterned conductive layer having a length that is similar to the length of the channel region and being located in proximity to the channel region, wherein the at least one gate may be used to modulate the conductivity of the channel region so that a conductive path may be formed between the drain region and the source region.

29. The nanotube field effect transistor of claim 28 wherein the nanotubes of the channel region comprise all P-type semiconducting nanotubes.

30. The nanotube field effect transistor of claim 28, wherein the nanotubes of the channel region comprise all ambipolar semiconducting nanotubes.

31. The nanotube field effect transistor of claim 28, wherein the nanotubes of the channel region comprise all N-type semiconducting nanotubes.

32. The nanotube field effect transistor of claim 28 including a front gate and a back gate in proximity of the channel region.

33. The nanotube field effect transistor of claim 32, wherein the back gate may be used to bias the transistor to translate a current voltage relationship of the transistor to a desired range and the front gate may be used to modulate the conductivity of the channel region.

34. The nanotube field effect transistor of claim 32, wherein the front gate may be used to bias the transistor to translate a current voltage relationship of the transistor to a desired range and the front gate may be used to modulate the conductivity of the channel region.

35. The nanotube field effect transistor of claim 28, wherein the patterned non-woven fabric of nanotubes is formed from a nanotube solution, and wherein the nanotube solution comprises semiconducting nanotubes and is substantially free from metallic nanotubes.

36. The nanotube field effect transistor of claim 28, wherein the patterned conductive layer is formed from a metallic material.

37. The nanotube field effect transistor of claim 28, wherein the patterned conductive layer is formed from a semiconductive material.

38. The nanotube field effect transistor of claim 28, wherein the length of the patterned conductive layer is longer than the length of the channel region.

39. The nanotube field effect transistor of claim 28, wherein the length of the patterned conductive layer is shorter than the length of the channel region.

40. The nanotube field effect transistor of claim 28, wherein the length of the patterned conductive layer is substantially equal to the length of the channel region.

41. The transistor of claim 28, wherein the functional material includes one or more of an oxygen atom, a pyrene molecule, and a combination thereof.

42. A method of making a plurality of nanotube field effect transistors, comprising:
    providing a substrate;
    forming a fabric of carbon nanotubes on the substrate, wherein at least one of the nanotubes includes a functional material adsorbed on a surface of the nanotubes, the functional material providing charge transfer states on the nanotubes;
    forming a drain region and a source region in spaced relation relative to each other for each nanotube field effect transistor in the plurality of nanotube field effect transistors;
    forming a channel region for each nanotube field effect transistor in the plurality of nanotube field effect transistors, wherein forming the channel region comprises:
        patterning the fabric of nanotubes; and
    forming a gate for each nanotube field effect transistor in the plurality of nanotube field effect transistors, wherein the gate may be used to modulate the conductivity of the channel region so that a conductive path may be formed between the drain region and the source region for each nanotube field effect transistor in the plurality of nanotube field effect transistors.

43. The method of claim 42, wherein the forming of the fabric of nanotubes on the substrate comprises applying a nanotube solution to the substrate, and wherein the nanotube solution comprises semiconducting nanotubes and is substantially free from metallic nanotubes.

44. The method of claim 42, wherein the length of the channel region between the drain region and the source region is less than the average length of the semiconducting nanotubes for each nanotube field effect transistor in the plurality of nanotube field effect transistors.

45. The method of claim 42, wherein the forming of the gate for each nanotube field effect transistor in the plurality of nanotube field effect transistors comprises:
    depositing a conductive layer in proximity to the channel region; and
    patterning the conductive layer to a length that is similar to the length of the channel region.

46. The method of claim 42, wherein the functional material includes one or more of an oxygen atom, a pyrene molecule, and a combination thereof.

* * * * *

UNITED STATES PATENT AND TRADEMARK OFFICE
CERTIFICATE OF CORRECTION

PATENT NO. : 8,362,525 B2  Page 1 of 1
APPLICATION NO. : 11/332529
DATED : January 29, 2013
INVENTOR(S) : Claude L. Bertin et al.

It is certified that error appears in the above-identified patent and that said Letters Patent is hereby corrected as shown below:

In the Claims

Column 17, Claim 18, Line 18:
"1" should be added after "The method of claim"

Signed and Sealed this
Nineteenth Day of August, 2014

Michelle K. Lee
*Deputy Director of the United States Patent and Trademark Office*